United States Patent [19]
Imamura et al.

[11] Patent Number: 6,075,420
[45] Date of Patent: Jun. 13, 2000

[54] OSCILLATORS WITH CHARGING AND DISCHARGING CIRCUITS

[75] Inventors: Yoichi Imamura; Shigeki Aoki; Norio Koizumi, all of Suwa, Japan

[73] Assignee: Seiko Epson Corporation, Tokyo, Japan

[21] Appl. No.: 08/794,241

[22] Filed: Jan. 31, 1997

Related U.S. Application Data

[62] Division of application No. 08/462,274, Jun. 5, 1995, Pat. No. 5,784,072.

[30] Foreign Application Priority Data

Jun. 6, 1994 [JP] Japan .................................. 6-123964

[51] Int. Cl.$^7$ ...................................................... H03B 5/24
[52] U.S. Cl. ......................... 331/111; 331/135; 331/143; 331/177 R
[58] Field of Search .................................. 331/111, 135, 331/143, 177 R

[56] References Cited

U.S. PATENT DOCUMENTS

| | | | |
|---|---|---|---|
| 3,723,907 | 3/1973 | Tajchman et al. | 331/143 |
| 3,878,482 | 4/1975 | Schowe, Jr. | 331/108 D |
| 4,115,748 | 9/1978 | Kubo et al. | 331/111 |
| 4,414,515 | 11/1983 | Suzuki et al. | 331/111 |
| 4,465,983 | 8/1984 | Hogeboom | 331/111 |
| 4,816,777 | 3/1989 | Benhamida | 331/57 |
| 4,857,866 | 8/1989 | Tateishi | 331/1 A |
| 5,689,239 | 11/1997 | Turner et al. | 340/572.1 |

FOREIGN PATENT DOCUMENTS

| | | |
|---|---|---|
| 0 233 550 | 8/1987 | European Pat. Off. . |
| 0 243 878 A1 | 11/1987 | European Pat. Off. . |
| 0 527 471 A1 | 2/1993 | European Pat. Off. . |

*Primary Examiner*—Siegfried H. Grimm
*Attorney, Agent, or Firm*—Oliff & Berridge, PLC

[57] ABSTRACT

An oscillation device includes a buffer device, a feedback device for feeding back an output of the buffer device to an input thereof and a charging device and a discharging device connected to the input of the buffer device. The charging device includes a first switching device that is turned on and off based on the output of the buffer device and a first current control device that controls the current flowing into the input of the buffer device through the first switching device. The discharging device includes a second switching device that is turned on or off based on the output of the buffer device and a second current control device that controls the current flowing out of the input of the buffer device through the second switching device. The first and second switching devices include first and second transistors and the first and second current sources that include third and fourth transistors. The oscillation device includes a bias circuit that controls at least the current ratio of the first and second current of the first and second current sources by controlling bias voltages applied to first and second bias terminals of the oscillation device.

2 Claims, 37 Drawing Sheets

OSCILLATORS WITH CHARGING AND DISCHARGING CIRCUITS

This is a Division of application Ser. No. 08/462,274 filed Jun. 5, 1995, and now U.S. Pat. No. 5,784,072.

BACKGROUND OF THE INVENTION

1. Field of the Invention

This invention relates to an oscillation device and a display data processing device, and in particular, to an oscillation device and display data processing device capable of operating with lower power consumptions.

2. Related Art

A prior-art oscillation device will first of all be described. The configuration of a CR oscillator circuit that is a typical example of a prior-art oscillation device is shown in FIG. 34. Inverters 200, 201, 202, and 203 are connected in series, and a capacitor 204 is connected between the output of inverter 201 and the input of the inverter 200. A resistor 205 is connected between the output of the inverter 202 and the input of the inverter 200. The inverter 203 provides waveform shaping. As is well known, the oscillation frequency of a CR oscillator circuit with capacitance C and resistance R is given by: $fOSC=1/(2.2 \times C \times R)$. Note, however, that this does not include the intrinsic delays of the inverters 200, 201, and 202.

The configuration of a ring oscillator that is another example of a typical prior-art oscillation device is shown in FIG. 35. Inverters 207, 208, 209, and 210 are connected in series, with the output of the inverter 209 being fed back to the input of the inverter 207. The inverter 210 provides waveform shaping. As is well known, the oscillation frequency of a ring oscillator wherein the delay in each inverter is t(207), t(208), and t(209) is given by: $fOSC=1/\{2 \times [t(207)+t(208)+t(209)]\}$.

However, there are problems with the above described CR oscillation circuit and ring oscillator, as described below.

First of all, the duty ratio of both oscillation signals is close to 50% and it is not possible to adjust this duty ratio easily.

With a matrix display device or similar device, which is the main type of application of a display data processing device, the frequency for displaying one frame is called the frame frequency, where the rating for this frame frequency is generally in the range of 70 Hz to 130 Hz. Thus, in order to obtain this rating, it is necessary to ensure that the accuracy of the oscillation frequency of a CR oscillation circuit is within the range of ±30%. However, variations of 10% to 30% can occur in the capacitances and resistances of capacitors and resistors on a semiconductor substrate during the manufacture thereof. Thus it is impossible in practice to fabricate capacitors and resistors simultaneously on a semiconductor substrate, and also ensure an accurate oscillation frequency. Therefore, most of the resistors of CR oscillation circuits used in display data processing devices are components that are mounted separately.

The oscillation frequency of the clock that is necessary for the above described matrix display device is of the order of 10 kHz to 500 Hz. However, if an attempt is made to produce such a low-frequency oscillation with a ring oscillator, the circuitry becomes extremely big and an extremely large number of components are necessary. Therefore, a ring oscillator cannot be used in practice as an oscillation device in a matrix display device.

CR oscillation circuits that can vary the duty ratio of the oscillation signal are known, such as that shown in FIG. 36. This CR oscillation circuit has the configuration similar to that shown in FIG. 34, but with the addition of a resistor 211 and a diode 212. The duty ratio of this circuit can be controlled by adjusting the resistance ratio between the resistors 205 and 211. However, this CR oscillation circuit still has problems, as described below. First, the diode 212 has a parasitic resistance and capacitance, and a leakage current is generated when the diode 212 is reverse-biased. These parasitic resistance, parasitic capacitance, and leakage current have a huge adverse effect on oscillation signal generation and maintenance, and on the accuracy of the oscillation frequency. Secondly, it is difficult to form other circuits, such as the inverter 200, on the same semiconductor substrate as a diode that has favorable characteristics, and if such circuits somehow could be formed, the fabrication cost would be high. Thirdly, it is not possible to use a current source instead of the resistors 205 and 211 as means of modifying the duty ratio of this CR oscillation circuit. Fourthly, there is a problem in that it is not possible to make common the inverter 202 that is necessary for polarity inversion and the diode 212 that is necessary for switching.

It is clear from the above that there are various different problems with prior-art oscillation devices.

The description now turns to a prior-art display data processing device. An example of the configuration of a prior-art display data processing device is shown in FIG. 37A. This display data processing device comprises a plurality of memories for processing display data. In this case, a first memory 504, a second memory 506, and a storage device 508 may be equivalent to, for example, an image display memory, an image display pattern generator (such as a character generation read-only memory (CGROM) or character generation random-access memory (CGRAM)), and a line memory, respectively. A timing generation circuit 502 outputs first and second address signals 512 and 514 and first, second, and third signals 516, 518, and 520 thereto. The first and second signals 516 and 518 act as read signals for the first and second memories 504 and 506, and the third signal 520 acts as a write signal for the storage device 508. A clock signal CK 510 from an oscillation device 500 is supplied to the timing generation circuit 502 and the timing generation circuit 502 generates various signals based on the clock signal CK 510, as shown in FIG. 37B. An address for the second memory 506 is generated in this display data processing device based on first data 522 that is an output of the first memory 504, then second data 524 that is an output of the second memory 506 is written to the storage device 508.

As shown in FIG. 37B, when a first signal 516 goes low (point F in FIG. 37B), a read operation of the first memory 504 starts and the first data 522 is read out. Since an address for the second memory 506 will be generated based on this first data 522, it is necessary for a second signal 518 to fall at least one clock later than the first signal 516 (point G). When the second signal 518 goes low, the second data 524 is output from the second memory 506. Since the storage device 508 will store this second data 524, it is necessary for the third signal 520 to fall at least one clock later than the second signal 518 (point H). The timing generation circuit 502 raises the first to third signals 516 to 520 to high when the data write to the storage device 508 ends.

With the above described prior-art display data processing device, signals of various different timings have to be generated by the timing generation circuit 502 to take into account the access times of the first and second memories and the storage device. Thus, as is clear from FIG. 37B, it is necessary to use a clock signal CK that has a frequency three to five times that of the first to third signals, to generate these signals, making it difficult to reduce the overall power consumption.

It is also possible to use devices such as a delay circuit based on a clock signal of the same frequency as the first to third signals, to generate the various timing signals shown in FIG. 37B. However, variations in quality due to the fabrication process make it extremely difficult to generate these signals while taking into account factors such as the access times of the first and second memories and the storage device. It is thus desirable to provide a display data processing device that can adjust autonomously timing between the first and second memories and the storage means, This invention was devised in order to solve the above concerns and has as its objective the provision of an oscillation device and a display data processing device that implements reductions in power consumption and circuit size.

Another objective of this invention is to provide an oscillation device that enables highly accurate, but simple, adjustment of the oscillation frequency and duty ratio of the oscillation signal.

A further objective of this invention is to provide a display data processing device having a plurality of memories, wherein the display data processing device enables autonomous control over the adjustment of timings between the memories.

SUMMARY OF THE INVENTION

In order to address the above described concerns with the prior art, a first aspect of this invention relates to an oscillation device comprising a buffer device, feedback means for feeding back an output of the buffer device to an input thereof, and charging means and discharging means connected to the input of the buffer means, wherein:

the charging means comprises a first switching means that is turned on or off based on the output of the buffer means and a first current control means for controlling a current flowing into the input of the buffer means through the first switching means, and the discharging means comprises a second switching means that is turned on or off based on the output of the buffer means and a second control means for controlling a current flowing into the input of the buffer means through the second switching means.

In accordance with this aspect of the invention, if the first switching means is turned on in accordance with the output of the buffer means, a current controlled by the first current control means flows into the input of the buffer means to start a charging operation. Similarly, if the second switching means is turned on in accordance with the output of the buffer means, a current controlled by the second current control means flows out through the input of the buffer means to start a discharging operation. An oscillating waveform can be generated by repeating these charging and discharging operations. This enables flexible, simple, and accurate adjustment of the oscillation frequency and duty ratio of the oscillation signal by using the first and second current control means to control the currents, thus lowering the power consumption and reducing the size of the circuitry.

A second aspect of this invention is characterized in that the first and second switching means are a first-conductive-type first transistor and a second-conductive-type second transistor, respectively, wherein the output of the buffer means is connected to gate electrodes thereof, and the first and second current control means are first and second resistors, respectively.

This aspect of the invention makes it possible to adjust the oscillation frequency and duty ratio of the oscillation signal by adjusting the resistances of the first and second resistors.

A third aspect of this invention is characterized in that the first and second switching means are a first-conductive-type first transistor and a second-conductive-type second transistor, respectively, wherein the output of the buffer means is connected to gate electrodes thereof, and the first and second current control means are first and second current sources, respectively.

This aspect of the invention makes it possible to adjust the oscillation frequency and duty ratio of the oscillation signal by adjusting the currents flowing through the first and to second current sources.

A fourth aspect of this invention is characterized in that the first and second current sources comprise a first-conductive-type third transistor and a second-conductive-type fourth transistor, respectively, and the oscillation device comprises a bias circuit having first and second bias terminals connected to the gate electrodes of the third and fourth transistors, respectively, wherein the bias circuit controls at least a current ratio of first and second currents of the first and second current sources, by controlling a bias voltage applied to the first and second bias terminals.

This aspect of the invention makes it possible to adjust the current ratio of the first and second currents by controlling the bias voltage applied to the first and second bias terminals, thus enabling control over the ratio of charging time to discharging time and adjustment of the duty ratio of the oscillation signal.

A fifth aspect of this invention further comprises means for controlling the magnitudes of the first and second currents.

This aspect of the invention makes it possible to adjust factors such as the oscillation frequency by controlling the magnitudes of the first and second currents.

A sixth aspect of this invention is characterized in that the bias circuit comprises a first-conductive-type fifth transistor wherein the gate electrode and drain region thereof are connected to the first and second bias terminals, respectively; a first-conductive-type sixth transistor wherein the gate electrode and drain region thereof are connected to the first bias terminal; a second-conductive-type seventh transistor wherein the gate electrode and drain region thereof are connected to the second bias terminal; and a second-conductive-type eighth transistor wherein the gate electrode thereof is connected to the second terminal and the drain region thereof is connected to the first bias terminal.

In accordance with this aspect of the invention, the same voltage is applied to the gate electrodes of the third, fifth, and sixth transistors. Similarly, the same voltage is applied to the gate electrodes of the fourth, seventh, and eighth transistors. The resultant current mirror effect enables the current flowing through the fifth transistor (or sixth transistor) to be "copied" to the third transistor and that flowing through the seventh transistor (or eighth transistor) to be "copied" to the fourth transistor. This makes it possible to adjust the oscillation frequency and duty ratio of the oscillation signal based on the currents flowing through the fifth and seventh transistors (or sixth and eighth transistors) and the beta values (transistor size) of the transistors.

A seventh aspect of this invention is characterized in that the gate electrode of the third transistor is connected to a third bias terminal instead of the first bias terminal, and the oscillation device comprises a first-conductive-type ninth transistor wherein the gate electrode and drain region thereof are connected to the third bias terminal; and a second-conductive-type tenth transistor wherein the gate electrode and drain region thereof are connected to the second and third bias terminals, respectively.

This aspect of the invention facilitates circuit design by making it possible to adjust the duty ratio using means such as the beta values (transistor size) of the third, fourth, ninth, and tenth transistors.

An eighth aspect of this invention relates to a display data processing device including N memories (where N is an integer) for processing display data, comprising:

a first memory for reading out data when a first signal has reached an enabled level;

a first equivalent circuit for outputting a second signal based on the first signal, and setting the second signal to an enabled level at least at a point at which or after data read from the first memory has been confirmed;

a Kth memory (where K is an integer such that $1 < K \leq N$) for reading out data based on an output of a (K−1)th memory when a Kth signal has reached an enabled level;

a Kth equivalent circuit for outputting a (K+1)th signal based on the Kth signal, and setting the (K+1)th signal to an enabled level at least at a point at which or after data read from the Kth memory has been confirmed; and storage means into which data read from the Nth memory is written when (N+1)th signal output from an Nth equivalent circuit has reached an enabled level.

In accordance with this aspect of the invention, data is read from the first memory when a first signal is enabled, and the read data is output to a second memory. The first equivalent circuit sets a second signal to enabled at the point at which or after data is read out from the first memory. When the second signal is enabled, data is read out from the second memory based on the output from the first memory. In this manner, data is read out sequentially, the data read from the Nth memory is stored in the storage means, and display data is generated based on this stored data. Thus this aspect of the invention enables autonomous control over the read operation, making it unnecessary to generate various timing signals and thus enabling a lower power consumption and a reduction in circuit size.

A ninth aspect of this invention is characterized in that at least one of the first to Nth memories and the storage means performs a precharge operation when the first to (N+1)th signals have reached a disabled level.

In accordance with this aspect of the invention, if the first to Nth memories and the storage means have a precharging function, they can switch to precharging when the corresponding first to (N+1)th signals have reached the disabled level.

A tenth aspect of this invention further comprises an (N+1)th equivalent circuit for outputting an (N+2)th signal based on the (N+1)th signal, and setting the (N+2)th signal to an enabled level at least at a point at which or after the read data has been written to the storage means; and means for setting at least one of the first to (N+1)th signals to a disabled level when the (N+2)th signal has reached the enabled level, and for selecting a precharge operation for at least one of the first to Nth memories and the storage means.

In accordance with this aspect of the invention, at least one of the first to Nth memories and the storage means can switch to precharging when the (N+2)th signal is set to the enabled level by the (N+1)th equivalent circuit. This aspect of the inventions enables autonomous control over the timing at which the switch to precharging occurs.

An eleventh aspect of this invention further comprises decoder means for generating a translated address signal from an address signal that is input to at least one of the first to Nth memories and the storage means; and an equivalent circuit for the decoder for outputting first' to (N+1)th' signals instead of the first to (N+1)th signals to any one of the first to Nth memories and the storage means, based on any one of the first to (N+1)th signals, and for setting the first' to (N+1)th' signals to an enabled level at a point at which or after the translated address signal output from the decoder means has been confirmed.

This aspect of the invention enables the translation of an address signal that is input to the first to Nth memories and the storage means. This means that the first to Nth memories and the storage means can perform an appropriate read operation by reading the data at the point at which or after the translated address signal is confirmed.

A twelfth aspect of this invention is characterized in that the storage means comprises first to Lth (where L is an integer) storage means for fetching first to Lth types of read data; and the display data processing device further comprises fetch signal control means for generating fetch signals for storing read data from the Nth memory in the storage means in a time-division manner for each horizontal period, and also controlling the timing at which the fetch signals are generated so that the first to Lth types of read data are fetched into the first to Lth storage means.

In accordance with this aspect of the invention, the read data may comprise different types of data such as character pattern data (first type of read data) and icon pattern data (second type of read data), and these types of data can be stored in corresponding first and second storage means by controlling the timing at which fetch signals are generated. This enables the display of images such as characters and icons at any desired position on a matrix panel when this invention is applied to a matrix-type display device.

A thirteenth aspect of this invention is characterized in that the fetch signal control means comprises at least one decoder means for generating a decode signal from an address signal that is input, wherein the decode signal is used as one of the fetch signals.

In accordance with this aspect of the invention, a decode signal generated by the decoder means can be used as one of the fetch signals, and data is fetched into the storage means based on one of the fetch signals. This makes it possible to generate fetch signals at any desired timing, by using decoder means with a programmable ROM and modifying the programming thereof.

A fourteenth aspect of this invention is characterized in that the plurality of memories comprise means for storing a code signal for an image display pattern and means for generating an image display pattern based on the code signal.

In accordance with this aspect of the invention, a signal such as a character code signal is stored in the first memory, and character pattern data corresponding to that character code signal is stored in the second memory. This makes it easy to arrange images such as characters on a matrix panel, for example.

A fifteenth aspect of this invention further comprises an oscillation device for outputting an oscillation signal for the generation of the first signal, wherein the oscillation device comprises means for controlling the duty ratio of the oscillation signal.

This aspect of the invention makes it possible to adjust the reading and precharging times of the first to Nth memories and the storage means by controlling the duty ratio of the oscillation signal.

A sixteenth aspect of this invention is characterized in that the oscillation device comprises buffer means, feedback means for feeding back an output of the buffer means to an input thereof, and charging means and discharging means connected to the input of the buffer means;

the charging means comprises a first switching means that is turned on or off based on the output of the buffer means and a first current control means for controlling a current flowing into the input of the buffer means through the first switching means, and the discharging means comprises a second switching means that is turned on or off based on the output of the buffer means and a second control means for controlling a current flowing into the input of the buffer means through the second switching means.

This aspect of the invention makes it possible to control the duty ratio of the oscillation signal by using the first and second current control means to control the charging and discharging currents, and thus adjust the reading and precharging times of the first to Nth memories and the storage means.

A seventeenth aspect of this invention is characterized in that a self-oscillation loop is formed by feeding back either the (N+1)th signal or an (N+2)th signal as the first signal.

This aspect of the invention makes it possible oscillation that makes use of signal delays in the equivalent circuits, and thus reducing power consumption.

An eighteenth aspect of this invention further comprises means for controlling at least one of the oscillation frequency and duty ratio in the self-oscillation loop.

This aspect of the invention makes it possible to ensure that the oscillation frequency and duty ratio are close to any desired values, when the delay of the equivalent circuits is changed by variations in quality due to the fabrication process.

A nineteenth aspect of this invention further comprises buffer means comprising the first to Nth equivalent circuits or first to (N+1)th equivalent circuits, feedback means for feeding back an output of the buffer means to an input thereof, and charging means and discharging means connected to the input of the buffer means, wherein:

the charging means comprises a first switching means that is turned on or off based on the output of the buffer means and a first current control means for controlling a current flowing into the input of the buffer means through the first switching means, and the discharging means comprises a second switching means that is turned on or off based on the output of the buffer means and a second control means for controlling a current flowing into the input of the buffer means through the second switching means.

This aspect of the invention makes it possible to ensure that the oscillation frequency and duty ratio are close to any desired values, when the delay of the equivalent circuits is changed by variations in quality due to the fabrication process, by using the first and second current control means to control the currents therein.

A matrix-type display device in accordance with a twentieth aspect of this invention comprises the above described display data processing device, a matrix panel wherein pixels are arranged in a matrix form and also a plurality of signal electrodes and a plurality of scan electrodes intersect a signal drive circuit for applying a drive voltage to the signal electrodes of the matrix panel, and a scan drive circuit for applying a drive voltage to the scan electrodes of the matrix panel, wherein:

at least the drive voltage of the signal drive circuit is generated based on data stored in the storage means of the display data processing device.

This aspect of the invention makes it possible to provide a matrix-type display device that is capable of operating faster with a lower power consumption.

DESCRIPTION OF PREFERRED EMBODIMENTS

Preferred embodiments of this invention will be described below with reference to the accompanying figures.

Embodiment 1

Embodiments 1 to 6 relate to oscillation devices.

Figure 1:
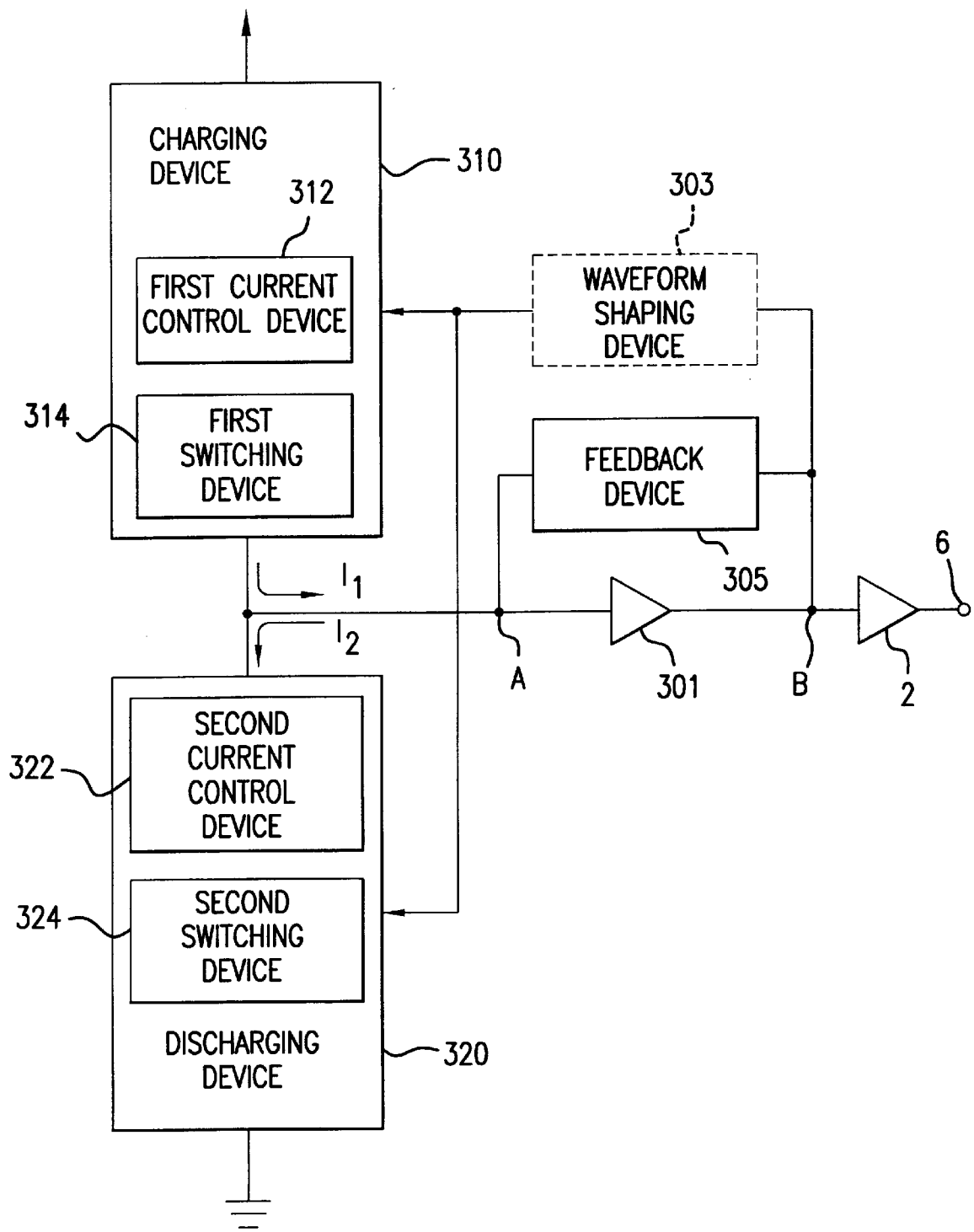
FIG. 1 shows the configuration of an oscillation device in accordance with Embodiment 1.

The configuration of an oscillation device in accordance with a first embodiment of this invention is shown in FIG. 1.

A feedback device 305 is provided between an input A and an output B of a MOS buffer 301. A charging device 310 and a discharging means 320 are connected in common to the input A of the MOS buffer 301. The output B of the MOS buffer 301 is input to the charging device 310 and the discharging device 320. Note that it is preferable to provide a waveform shaping device 303 formed of components such as inverters and a buffer in this case.

The charging device 310 comprises a first current control device 312 and a first switching device 314. The first switching device 314 turns on and off on the basis of the output B of the MOS buffer 301, and the first current control device 312 controls a charging current I1 flowing into the input A of the MOS buffer 301 through the first switching device 314. The discharging device 320 comprises a second current control device 322 and a second switching device 324. The second switching device 324 turns on and off on the basis of the output B of the MOS buffer 301, and the second current control device 322 controls a discharging current I2 flowing out from the input A of the MOS buffer 301 through the second switching device 324.

Figure 2:
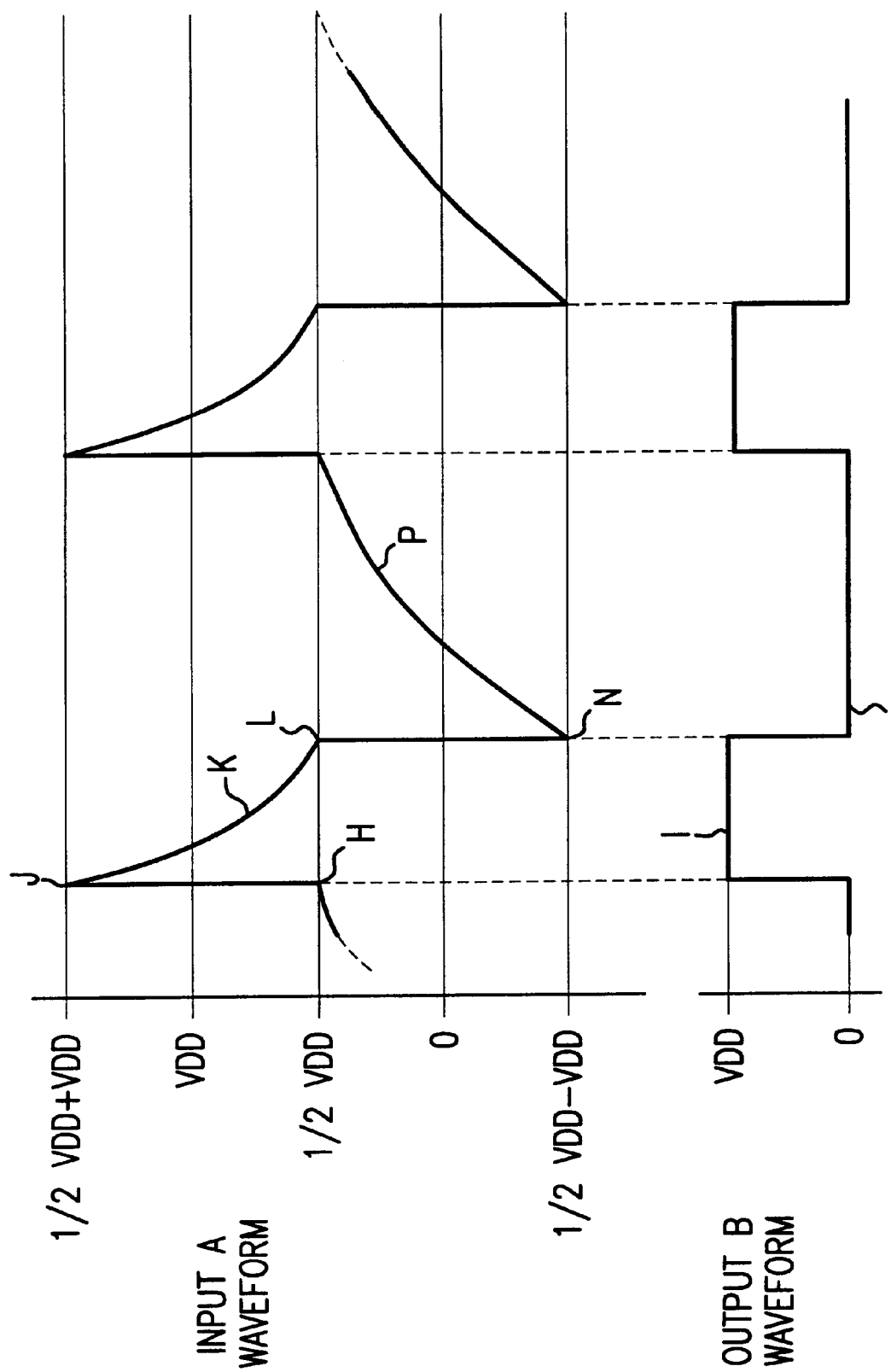
FIG. 2 is a waveform chart illustrating the operation of Embodiment 1.

The operation of Embodiment 1 will now be described. A waveform chart illustrating the input A and output B of the MOS buffer 301 is shown in FIG. 2. Assume that the threshold voltage of the MOS buffer 301 is (½)×VDD. If so, at the point at which the input A of the MOS buffer 301 exceeds (½)×VDD (point H in FIG. 2), the output e of the MOS buffer 301 rises from a low level to a high level (point I) and the input A of the MOS buffer 301 through the feedback device 305 becomes {(½)×VDD+VDD} (point J). Since the output B is high, the second switching device 324 within the discharging device 320 is selected and turns on, and a current discharges from the input A of the MOS buffer 301. This causes the potential at the input A to gradually drop (portion K). When the input A has fallen to slightly below the threshold voltage of (½)×VDD (point L), the output B of the MOS buffer 301 falls to low (point M). This causes the feedback device 305 to drop the potential of input A to {(½)×VDD−VDD} (point N). This time, the output B is low so the first switching device 314 within the charging device 310 is selected and turns on, causing a charging current to flow into the input A of the MOS buffer 301. This causes the potential at the input A to gradually rise (portion P). This repeated cycle of discharging and charging enables the production of an oscillation signal as shown by the output B waveform in FIG. 2. Note that it is not absolutely necessary for the MOS buffer 301 to be configured of MOS transistors, provided that it functions at least as a buffer device.

Figure 36:
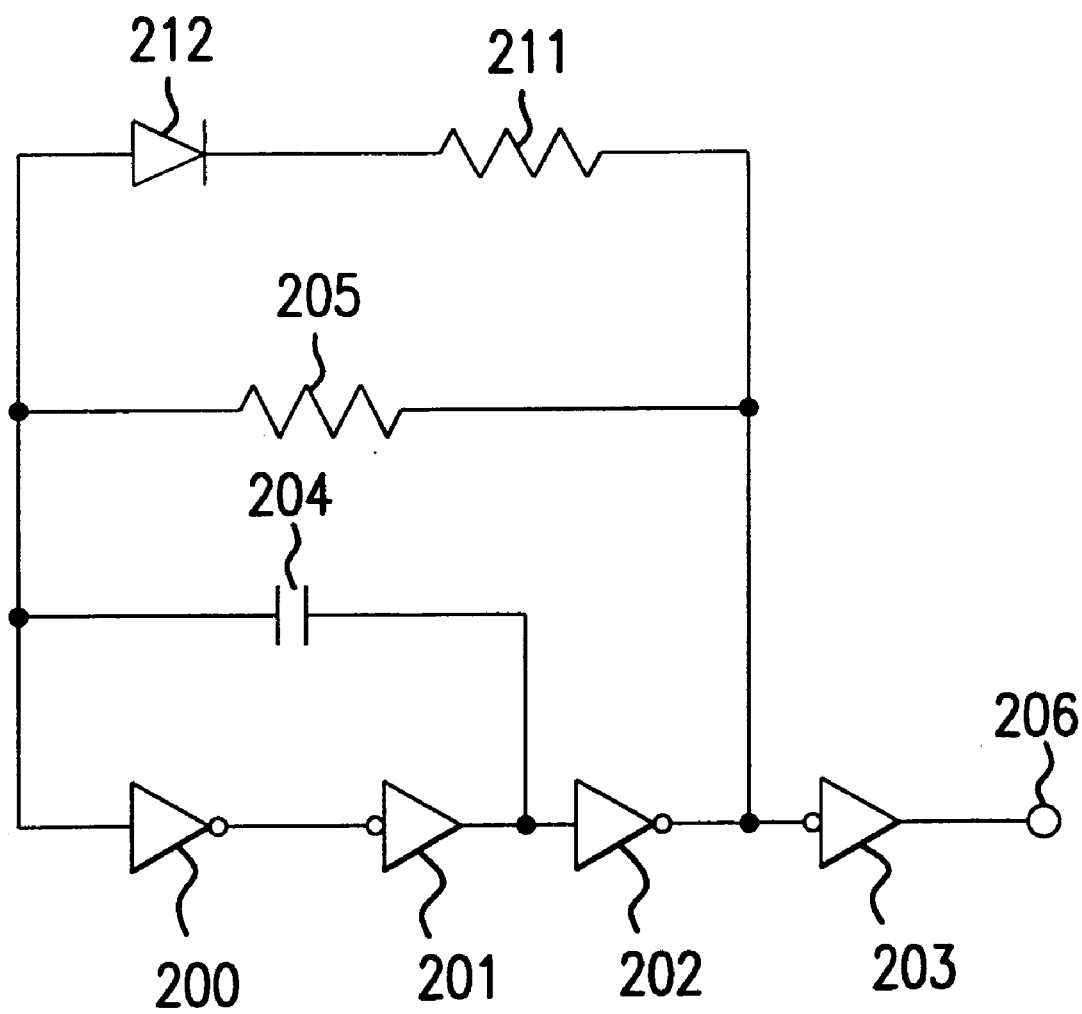
FIG. 36 shows the configuration of a CR oscillation circuit capable of adjusting the duty ratio of an oscillation signal thereof.

As is clear from FIG. 2, this embodiment makes it possible to provide an oscillation signal (oscillaton waveform) of any desired frequency and duty ratio. The frequency and duty ratio can be adjusted by using the first and second current control devices 312 and 322 to control the currents I1 and I2. For example, if these currents are controlled in such a manner that I2 is greater than I1, the oscillation signal shown in FIG. 2 is obtained. With this embodiment, it is no longer necessary to consider the parasitic resistance and capacitance of the diode used in the prior-art example of FIG. 36, and thus a highly accurate oscillation signal can be obtained with few variations in processing quality. Since the first and second switching devices 314 and 324 can be given the functions of both a polarity inversion device (equivalent to the inverter 202 of FIG. 36) and a charging/discharging switching device (equivalent to the diode 212 of FIG. 36), the number of circuit components can be reduced and also the accuracy with which the oscillation frequency and duty ratio are selected can be increased.

Embodiment 2

Figure 3:
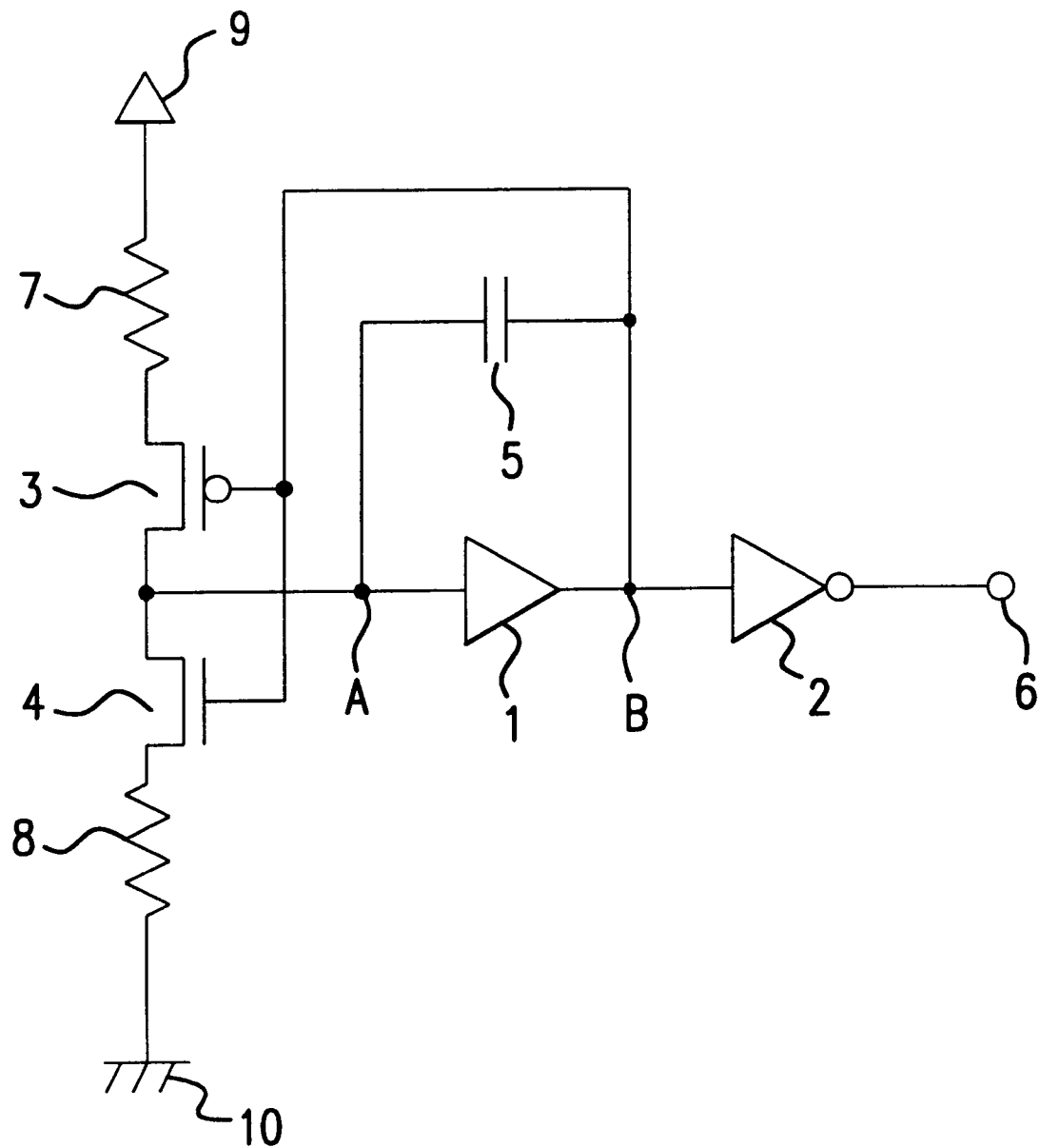
FIG. 3 shows the configuration of an oscillation device in accordance with Embodiment 2.

A second embodiment of the invention relates to a specific configuration of the charging and discharging devices, with the circuit configuration thereof being as shown in FIG. 3. Resistors 7 and 8 in FIG. 3 are equivalent to the first and second current control devices 312 and 322 of FIG. 1, and a p-type MOS transistor 3 and an n-type MOS transistor 4 are equivalent to the first and second switching devices 314 and 324.

An input A of a MOS buffer 1 (equivalent to MOS buffer 301) is connected to the drain regions of the p-type MOS transistor 3 and the n-type MOS transistor 4, as well as to a capacitor 5 (equivalent to feedback device 305). An output B of the MOS buffer 1 is connected to the gate electrodes of the p-type MOS transistor 3 and n-type MOS transistor 4, as well as to the capacitor 5 (equivalent to feedback device 305). The source regions of the p-type MOS transistor 3 and n-type MOS transistor 4 are connected to one end of the corresponding resistors 7 and 8, respectively. The other ends of the resistors 7 and 8 are connected to a high-potential power source VDD 9 and a low-potential power source VSS (GND) 10. A MOS inverter 2 provides waveform shaping.

The operation of the above embodiment will now be described. First of all, the output B of the MOS buffer 1 rises to high when the input potential of the MOS buffer 1 has slightly exceeded the threshold voltage (½)×VDD, and the capacitive coupling through the capacitor 5 causes the potential of the input A of the MOS buffer 1 to reach {VDD+(½)×VDD}. The p-type MOS transistor 3 turns off and the n-type MOS transistor 4 turns on. The resistances of the resistors 7 and 8 (Rp and Rn) are sufficiently greater than the on-resistances of the p-type MOS transistor 3 and the n-type MOS transistor 4, and the capacitance of the capacitor 5 is C. Thus the potential of the input A of the MOS buffer 1 falls (discharges) at a time Tn=C×Rn.

Next, when the input potential of the MOS buffer 1 becomes lower than the threshold voltage (½)×VDD, the p-type MOS transistor 3 turns on and the potential of the input A of the MOS buffer 1 rises (charges) at a time Tn=C×Rp.

Thus the oscillation frequency fOSC2 and duty ratio D2 obtained by Embodiment 2 are given by fOSC2=1/(Tn+Tp) and D2=Rn/(Rn+Rp). However, the intrinsic delay of the MOS buffer 1 is omitted for simplicity.

Note that FIG. 3 shows a configuration in which the transistors 3 and 4 are connected to the input A of the MOS buffer 1, but the configuration could equally well be one in which the resistors 7 and 8 are connected directly to the input A of the MOS buffer 1 and the transistors 3 and 4 are connected to the power sources 9 and 10.

Embodiment 3

Figure 4:
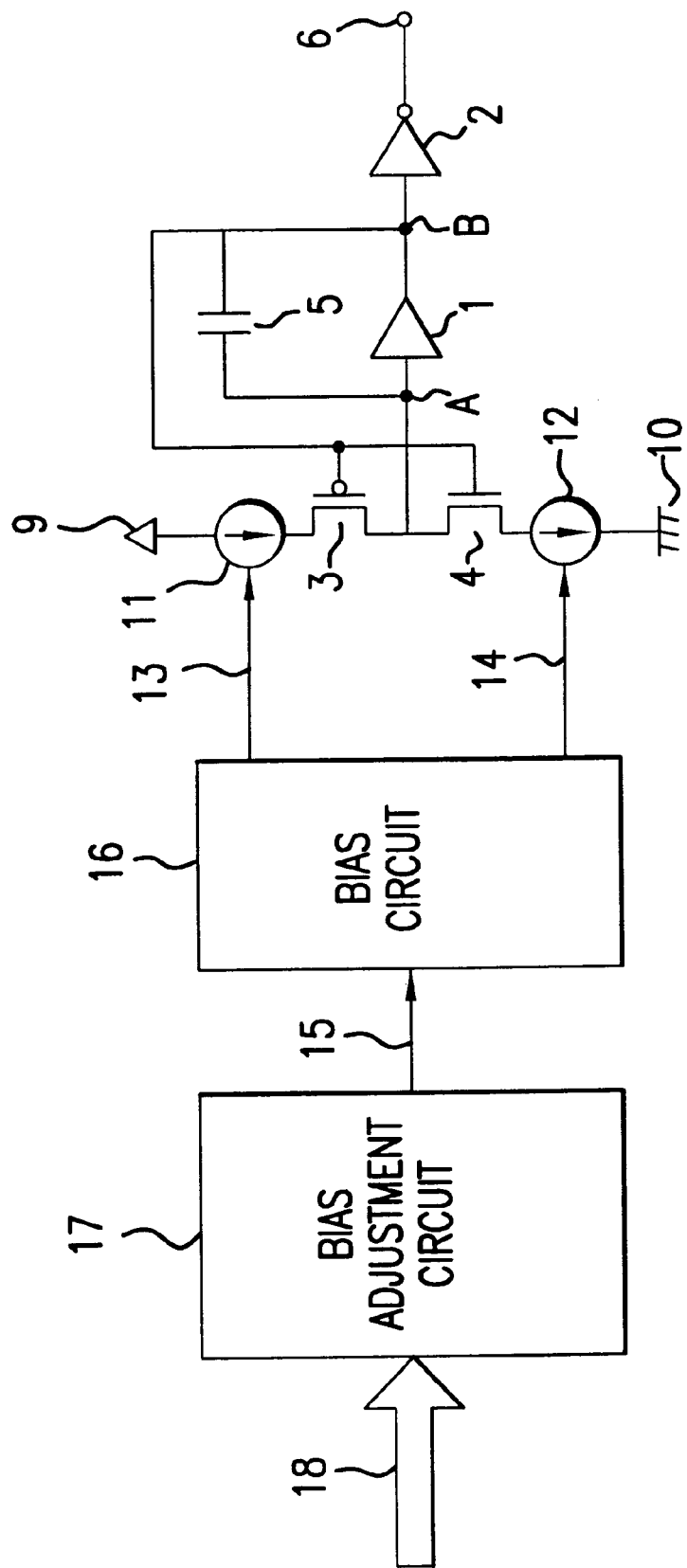
FIG. 4 shows the configuration of an oscillation device in accordance with Embodiment 3.

A third embodiment of the invention relates to another example of a specific configuration of the charging and discharging devices, with the circuit configuration thereof being as shown in FIG. 4. This embodiment differs from Embodiment 2 in that the current control devices have been changed from the resistors 7 and 8 to current sources 11 and 12. In other words, the charging and discharging of the current from the input A of the MOS buffer 1 is performed by the current sources 11 and 12.

Figure 5:
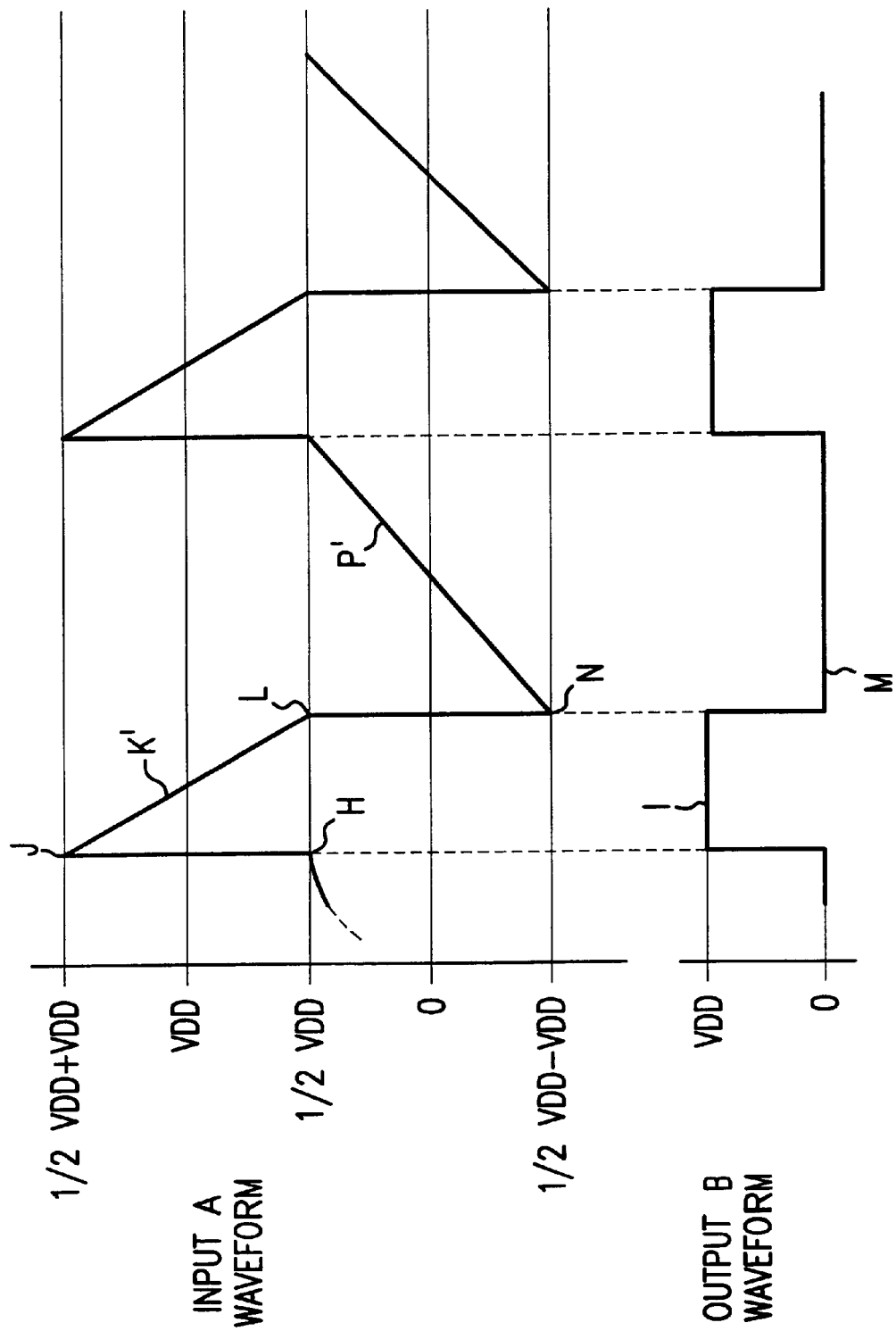
FIG. 5 is a waveform chart illustrating the operation of Embodiment 3.

A waveform chart illustrating the input A and output B of the MOS buffer 1 is shown in FIG. 5. This waveform chart differs from that of FIG. 2 in that the potential of the input A varies in a linear manner during the charging and discharging (portions K' and P' of FIG. 5). If the potential of the input A varies linearly in this manner, variations in the oscillation frequency and duty ratio can be made smaller than those that occur with the configuration of FIG. 2, even if variations or noise occur during the fabrication process, and thus an accurate oscillation frequency and duty ratio can be obtained. Since the rest of the operation of this embodiment is the same as that of Embodiments 1 and 2, description thereof is omitted.

If the currents flowing from the current sources 11 and 12 are assumed to be In and Ip, the oscillation frequency fOSC3 and duty ratio D3 of the oscillation device of Embodiment 3 are given by fOSC3=1/(Tn+Tp) and D3=In/(In+Ip). It should be noted, however, that Tn=C×V/In and Tp=C×V/Ip, with the intrinsic delay of the MOS buffer 1 being omitted. Thus, Embodiment 3 enables adjustment of the duty ratio of the oscillation signal by simply adjusting the ratio of In to Ip.

Note that it is preferable to provide a bias circuit 16 and a bias adjustment circuit 17 if current sources are used as the current control devices, as shown in FIG. 4. In such a case, the bias circuit 16 is designed to impose bias signals on the current sources 11 and 12 through bias terminals 13 and 14. The bias adjustment circuit 17 is designed to impose a bias adjustment signal on the bias circuit 16 through a terminal 15. Use of the bias circuit 16 and the bias adjustment circuit 17 ensures that the oscillation frequency and duty ratio can be freely adjusted.

Note that the transistors 3 and 4 are connected to the input A of the MOS buffer 1 in the configuration of FIG. 4, but the configuration could be reversed so that the current sources 11 and 12 are connected to the input A of the MOS buffer 1 and the transistors 3 and 4 are connected to the power source 9 and ground 10. However, the configuration shown in FIG. 4 is preferable for improving the capabilities of the current sources.

Embodiment 4

Figure 6:
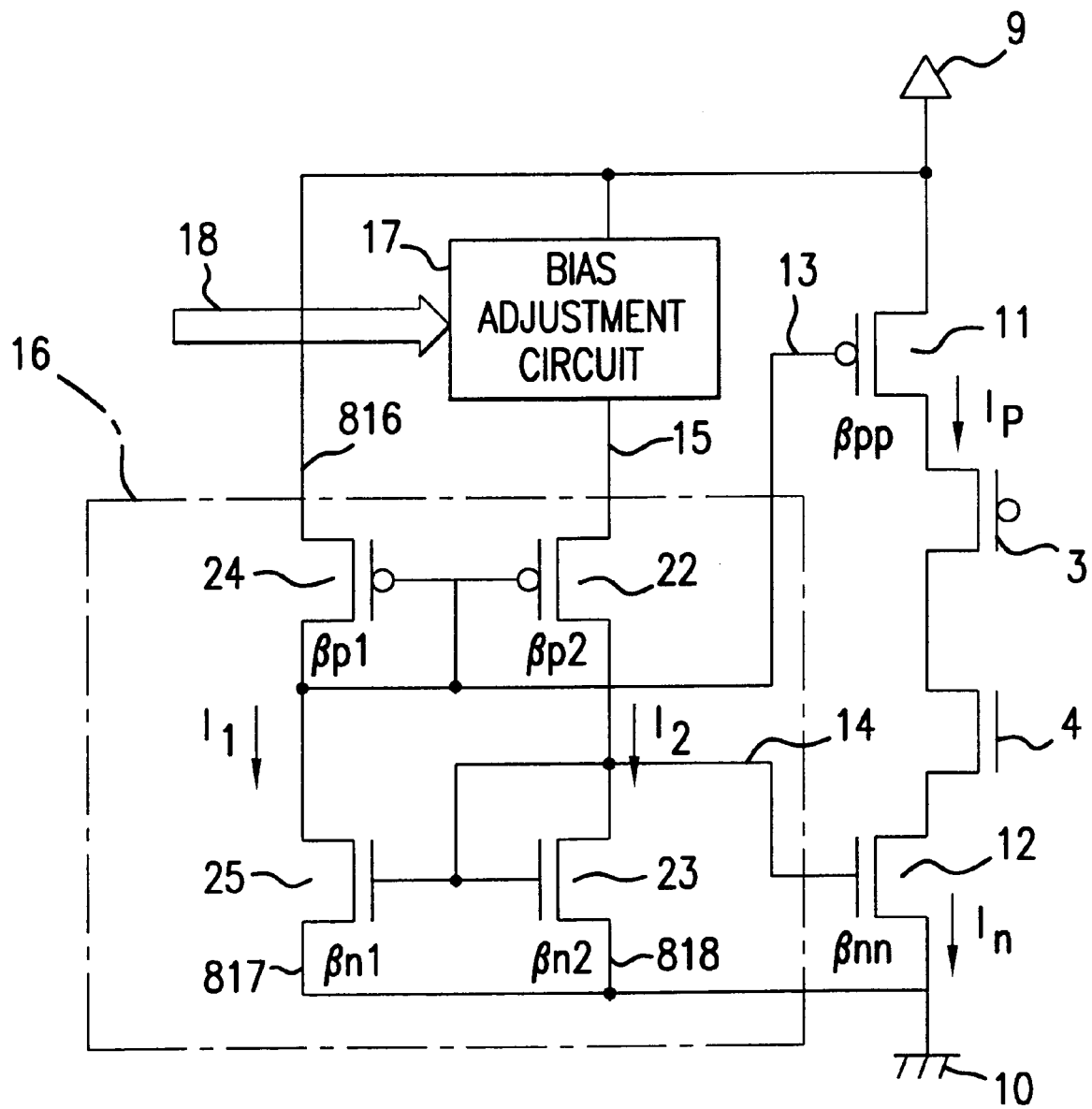
FIG. 6 shows a specific configuration of the current sources and bias circuit.

A fourth embodiment of the invention relates to an example of a specific configuration of the current sources and bias circuit, with the circuit configuration thereof being shown in FIG. 6.

In Embodiment 4, a p-type MOS transistor 11 (third transistor) and an n-type MOS transistor 12 (fourth transistor) act as the current sources 11 and 12. The gate electrode of a p-type MOS transistor 22 (fifth transistor) is connected to the bias terminal 13 (first bias terminal) and the drain region thereof is connected to the bias terminal 14 (second bias terminal). The gate electrode and drain region of a p-type MOS transistor 24 (sixth transistor) are connected to the bias terminal 13. Similarly, the gate electrode and drain region of an n-type MOS transistor 23 (seventh transistor) are connected to the bias terminal 14. The gate electrode of an n-type MOS transistor 25 (eighth transistor) is connected to the bias terminal 14 and the drain region thereof is connected to the bias terminal 13.

Assume that the beta values of the transistors 11 and 12 are βpp and βnn, respectively, and the beta values of the transistors 22, 23, 24, and 25 are βp2, βn2, βp1, and βn1, respectively. In such a case, the currents flowing in the transistors 11, 22, and 24 are distributed in accordance with the individual beta values of those transistors and are made uniform by the current mirror effect, and the currents flowing in the transistors 12, 23, and 25 are similarly allocated by the individual beta values of those transistors and are made uniform by the current mirror effect.

Therefore, the following equations hold:

$$Ip=(\beta pp/\beta p1)\ I1=(\beta pp/\beta p1)\times(\beta n1/\beta n2)\ I2 \quad (1)$$

$$In=(\beta nn/\beta n2)\ I2 \quad (2)$$

and thus:

$$(Ip/In)=(\beta pp/\beta p1)\times(\beta n1/\beta nn) \quad (3)$$

In this case, the oscillation frequency fOSC4 of the circuit is given by:

$$fOSC4=1/(Tn+TP)=(1/Cv)\times\{Ip\times In/(Ip+In)\} \quad (4)$$

where Tn=C×V/In and Tp=C×V/Ip, with the intrinsic delay of the MOS buffer 1 being omitted.

As is clear from Equations (1), (2), and (4), the oscillation frequency fOSC4 can be adjusted to any desired value by adjusting the current I2, and this current I2 can be adjusted by using the bias adjustment circuit 17. Since the duty ratio D4 in this case is given by D4=In/(In+Ip), it is clear from Equation 3 that it can be set to any desired value by varying the size ratio of the transistors.

Embodiment 5

Figure 7:
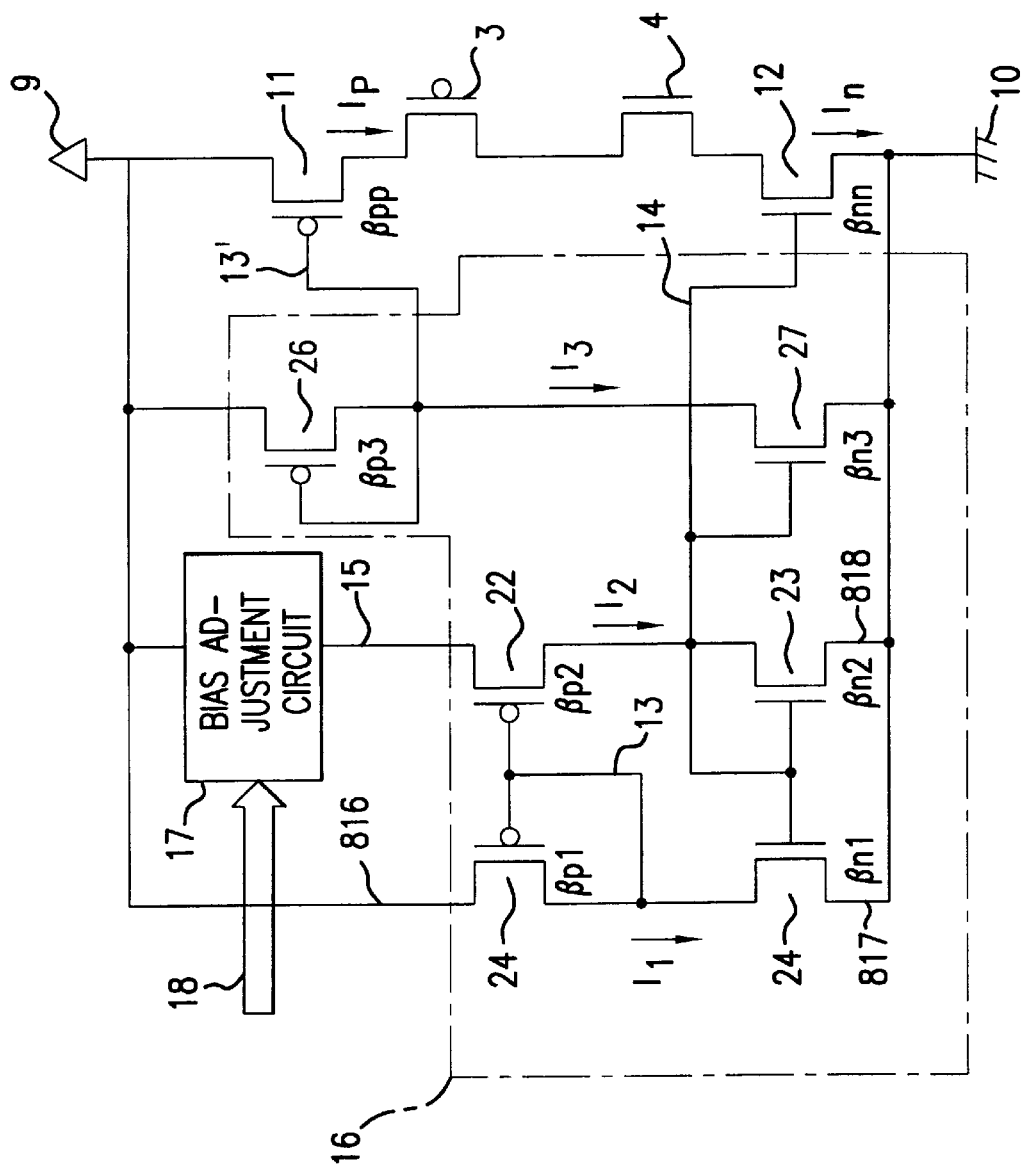
FIG. 7 shows another specific configuration of the current sources and bias circuit.

A fifth embodiment of the invention relates to an example of the specific configuration of the current sources and bias circuit, with the circuit configuration thereof being as shown in FIG. 7. This embodiment differs from Embodiment 4 in that a p-type MOS transistor 26 and n-type MOS transistor 27 are also provided, and a voltage is applied to the gate electrode of the p-type MOS transistor 11 by a bias terminal 13' (third bias terminal), not the bias terminal 13. The gate electrode and source region of the p-type MOS transistor 26 (ninth transistor) are connected to the bias terminal 13', the gate electrode of the n-type MOS transistor 27 (tenth transistor) is connected to the bias terminal 14, and the drain region thereof is connected to the bias terminal 13'.

If the beta values of the transistors 26 and 27 are assumed to be $\beta p3$ and $\beta n3$, the current mirror effect ensures that the following equations hold:

$$Ip=(\beta pp/\beta p3)\ I3=(\beta pp/\beta p3)\times(\beta n3/\beta n2)\ I2 \qquad (5)$$

$$In=(\beta nn/\beta n2)\ I2 \qquad (6)$$

and thus:

$$(Ip/In)=(\beta pp/\beta p3)\times(\beta n3/\beta nn) \qquad (7)$$

As is clear from Equations (5) and (6), the oscillation frequency fOSC5 can be adjusted to any desired value by adjusting the current I2 from the bias adjustment circuit 17, in a manner similar to that of the above described Embodiment 4. The duty ratio D5 can also be set to any desired value by means such as modifying the transistor size ratio, as is clear from Equation 7.

Note that the configuration of Embodiment 5 has several advantages over that of Embodiment 4, as described below. With the configuration of Embodiment 4 shown in FIG. 6, the duty ratio can be adjusted by adjusting the sizes of the transistors 24 and 25, as is clear from Equation 3. However, for various reasons such as the way in which the bias adjustment circuit 17 is connected to the terminal 15, the voltages applied between the drain and source regions of each of the transistors 24 and 25 are small. This means that in order for the transistors 24 and 25 to operate in the saturation region, the transistor sizes are limited to a certain degree. This limitation on the configuration of Embodiment 4 makes design difficult, because the duty ratio should be adjusted in addition to the adjusting the transistor sizes of the transistors 24 and 25. In contrast, the duty ratio in the configuration of Embodiment 5 is adjusted by adjusting the sizes of the transistors 26 and 27, as is clear from Equation 7. Thus design is easier because the sizes of the transistors 24 and 25 can be adjusted independently of the setting of the duty ratio. This difference in facility for design becomes even more dramatic when the power voltage has been reduced.

Note that the bias adjustment circuit 17 is inserted at the position of the terminal 15 in Embodiments 4 and 5, but this invention is not limited to such a configuration; it could be inserted at the position of any of terminals 816, 817, or 818 (See FIG. 7).

Embodiment 6

A sixth embodiment of this invention relates to specific examples of the bias adjustment circuit. The configurations shown in FIGS. 8A to 8D illustrate the bias adjustment circuit.

Figure 8A:
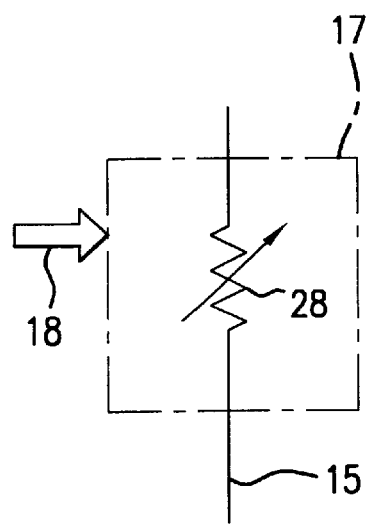
FIGS. 8A to 8D show specific configurations of the bias adjustment circuit.

The bias adjustment circuit of FIG. 8A comprises a variable resistor 28, and the oscillation frequency is adjusted by using a frequency selection signal 18 to adjust the resistance of the variable resistor 28.

Figure 8B:
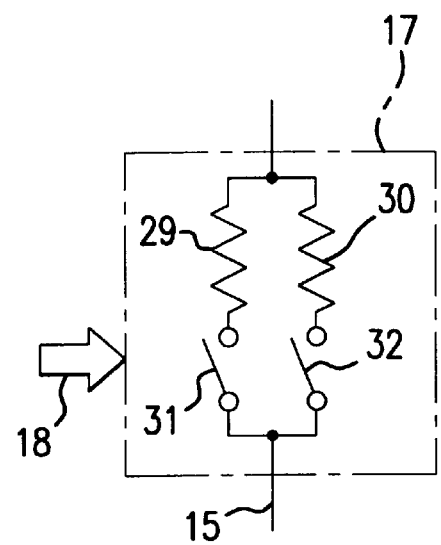

The bias adjustment circuit of FIG. 8B comprises resistors 29 and 30 with switches 31 and 32 connected thereto, and the oscillation frequency is adjusted by selecting the switches 31 and 32 according to the frequency selection signal 18.

Figure 8C:
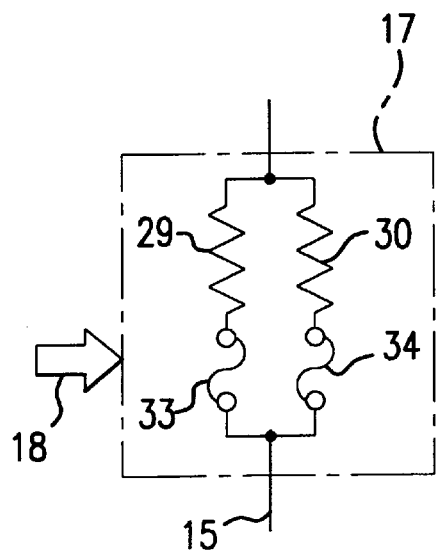

The bias adjustment circuit of FIG. 8C comprises the resistors 29 and 30 with fuses 33 and 34 connected thereto, and the oscillation frequency is adjusted by selecting the fuses 33 and 34 according to the frequency selection signal 18.

Figure 8D:
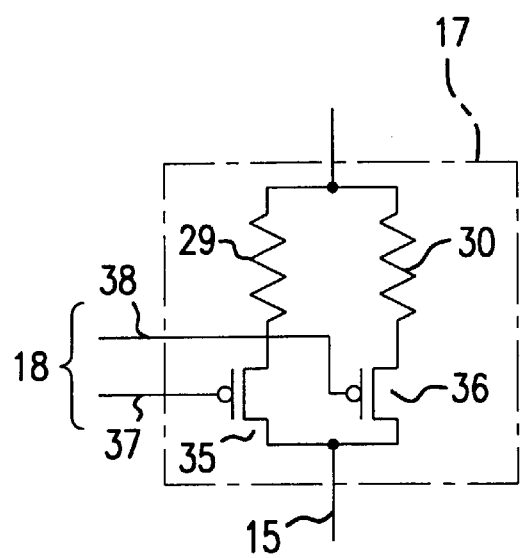

The bias adjustment circuit of FIG. 8D comprises the resistors 29 and 30 with MOS transistors 35 and 36 connected thereto, and the oscillation frequency is adjusted by sending control signals 37 and 38, which act as the frequency selection signal 18, to the gate electrodes of the MOS transistors 35 and 36.

Note that each of FIGS. 8B to 8D shows an example in which two resistors are provided in parallel, but in practice any number of resistors may be provided.

These resistors may also be configured as MOS transistors. In such a case, the switches 31 and 32 of FIG. 8B, for example, may be configured of MOS transistors, with the on resistances of these MOS transistors replacing the resistances of the resistors 29 and 30.

Note that this invention may also be applied to a voltage-controlled oscillator (VCO) by adjusting the currents In and Ip of the current sources 11 and 12, or by adjusting the current flowing through the terminal 15 of FIGS. 6 and 7 or the voltage applied across the terminal 15. If, for example, this invention is used for a VCO, the addition of a phase comparison circuit and filter would enable the configuration of a phase-locked loop (PLL) circuit. Various applications of the configuration may be considered, as described below. For example, a plurality of display data processing devices may be provided for a liquid crystal panel, and switching between display data stored in this plurality of display data processing devices may be used to display data on the liquid crystal panel. In such a case, oscillation devices built into the display data processing devices will all oscillate at different frequencies, so that the frequencies of the frame signals of the display data processing devices will also be scattered within the range of 70 Hz to 130 Hz (rated range). Thus it is necessary to synchronize these frame signals to enable the use of switching between the display data from the plurality of display data processing devices. In this case, an external frame signal from outside (another display data processing device) and an internal frame signal formed from the output of the VCO are input to a phase comparison circuit where the phases thereof are compared. Filters convert the output of the phase comparison circuit until it has a suitable voltage and current, and the resultant output input to the VCO. This enables synchronization of frame signals between one display data processing device and other display data processing devices. As a result, faults such as distortion of the display image can be avoided when switching between display data from a plurality of display data processing devices.

Embodiment 7

Seventh to twelfth embodiments of the invention described below relate to display data processing devices.

Figure 9:
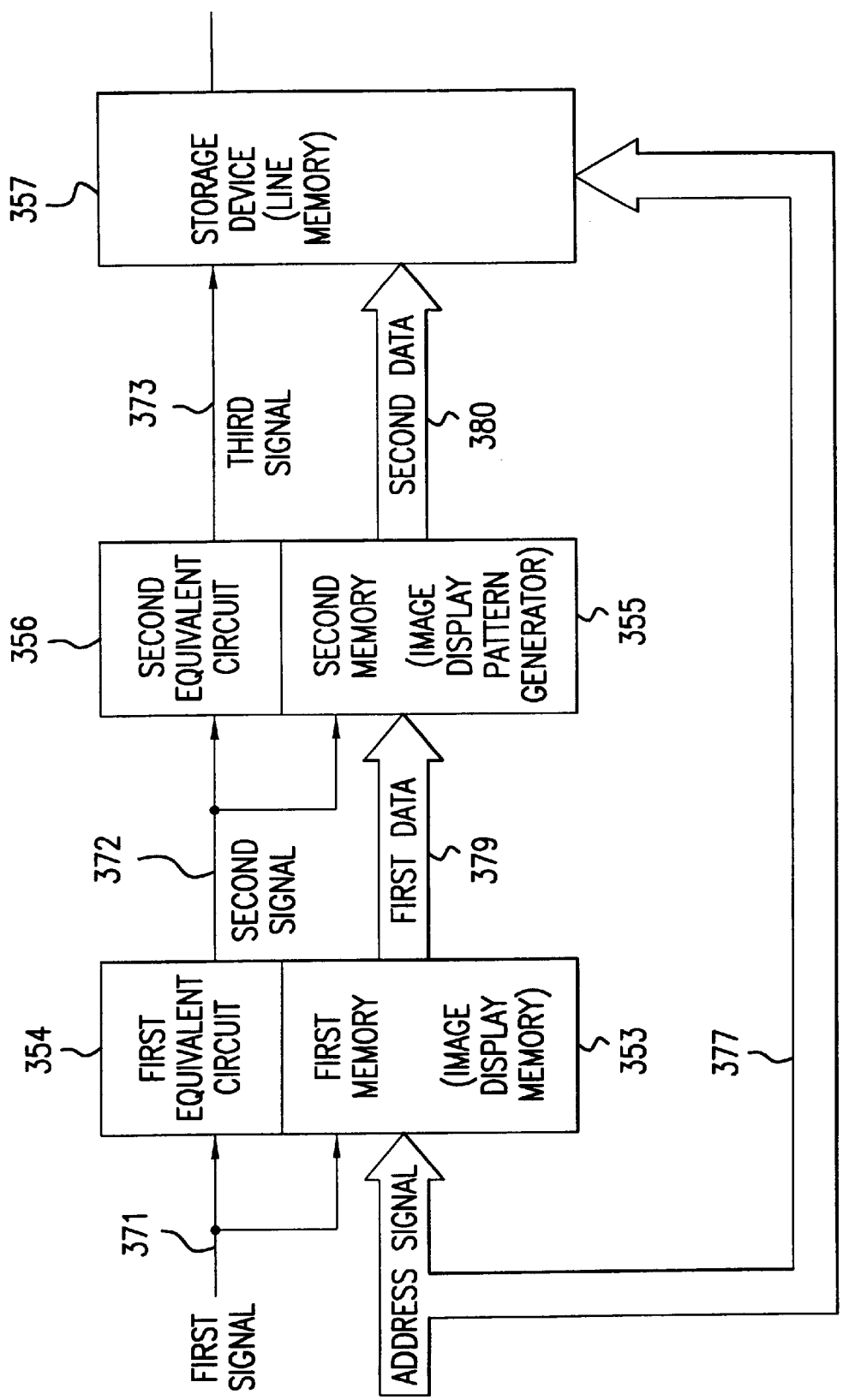
FIG. 9 shows the configuration of a display data processing device of Embodiment 7.

The configuration of a display data processing device according to Embodiment 7 is shown in FIG. 9. Embodiment 7 comprises a first memory (an image display memory) 353, a second memory (an image display pattern generator) 355, a storage device (a line memory) 357, and first and second equivalent circuits 354 and 356. The features of Embodiment 7 are described below. A first signal 371 is input to the first memory 353 and the first equivalent circuit 354 and, when this first signal 371 reaches an enabled level (for example, when it goes low), a read operation from the first memory 353 is performed to output first data 379. The read address during this time is determined by an address signal 377. In this case, the first equivalent circuit 354 is designed to output a second signal 372 based on the first signal 371 and this second signal 372 reaches an enabled level (such as low) at the point at which it has been confirmed that the first data 379 has been read out from the first memory 353, or thereafter. The second signal 372 is input to the second memory 355 and the second equivalent circuit 356, and a read operation is performed to output second data 380 when this second signal 372 reaches the enabled level. This read from the second memory 355 is based on the first data 379. The second equivalent circuit 356 is designed to output a third signal 373 based on the second signal 372, and this third signal 373 reaches an enabled level (such as low) at the point at which it has been confirmed that the second data 380 has been read out from the second memory 355, or thereafter. A write operation is performed to write the second data 380 to a storage device 357 when the third signal 373 reaches the enabled level. The storage address in this case is determined by means such as the address signal 377.

As described above, when each of the first, second, and third signals 371, 372, and 373 of Embodiment 7 reach the enabled level, data is read from the corresponding first and second memories 353 and 355 or written to the storage device 357. In addition thereto, at least one of the first and second memories 353 and 355 and the storage device 357 may precharge when the corresponding first, second, and third signals 371, 372, and 373 reach a disabled level (such as high). Such a configuration would make it possible to implement a selection of either reading or precharging for the first and second memories 353 and 355 and the storage device 357, by simply controlling the level of a signal such as the first signal 371, thus simplifying the circuit control. Setting of the read period and precharge period can also be implemented by simply controlling the duty ratio of the first signal 371 and other signals. Use of an oscillation device capable of providing duty ratio adjustment, as described with reference to the above Embodiments 1 to 6, has some specific advantages. In other words, the settings of the read period and precharge period can be freely adjusted by generating the first signal 371 from the output of the oscillation device of any of Embodiments 1 to 6 and adjusting the duty ratio of the oscillation device.

Note that the relationship between the time required for reading data (the read access time) and the time necessary for precharge (the precharge access time) is such that, if the read access time is assumed to be 100, the precharge access time is generally of the order of 5 to 40 (preferably of the order of 10 to 30). Thus the first signal 371 preferably has a waveform with a duty ratio of the order of 5% to 40%.

Figure 10:
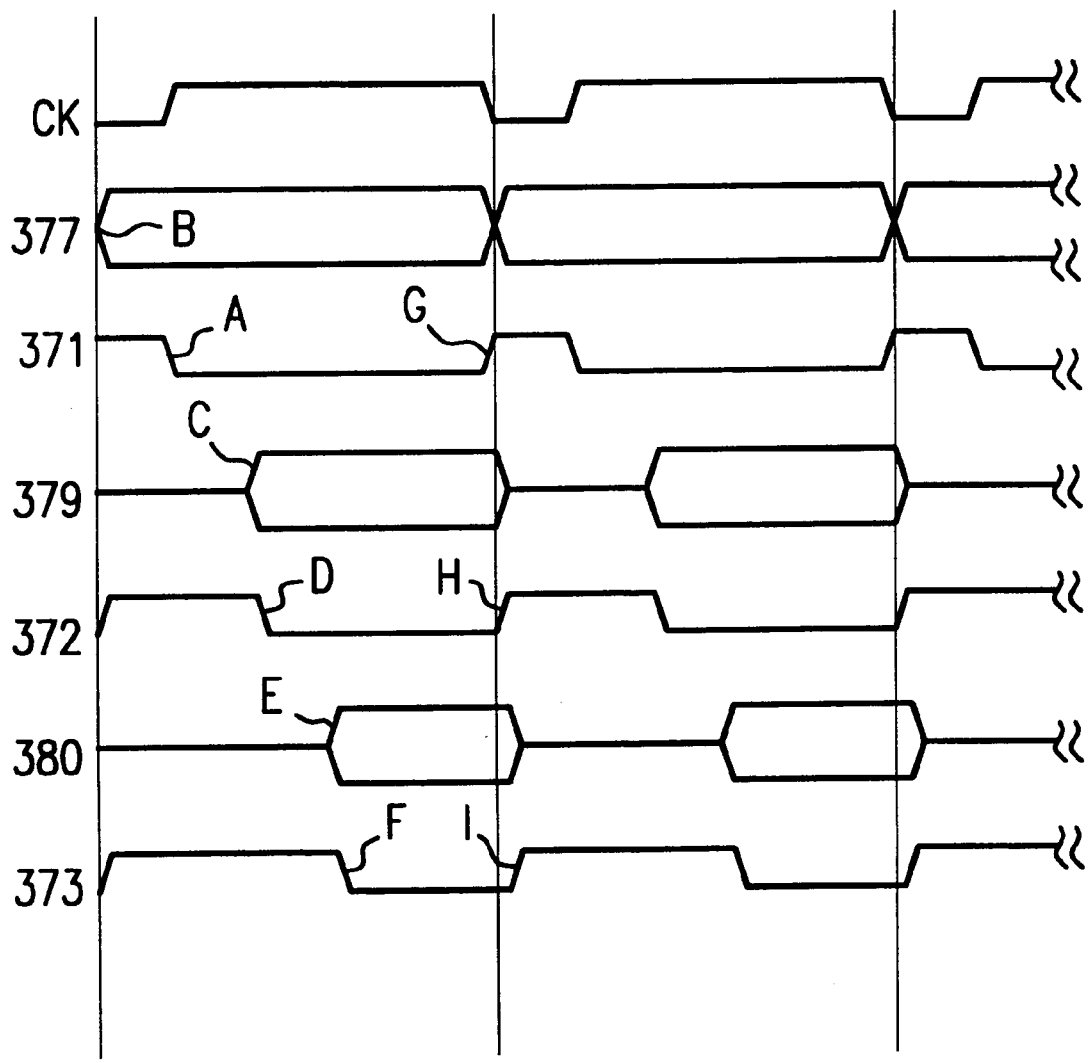
FIG. 10 is a timing chart illustrating the operation of Embodiment 7.

The operation of Embodiment 7 will now be described with reference to the timing chart of FIG. 10. First of all, the first signal 371 goes low (reaches the enabled level) at a point A in FIG. 10. At this point, the address signal 377 has already been confirmed, before the first signal 371 goes low (point B). Note that CK in FIG. 10 refers to a clock signal that may be generated by the oscillation device described above with reference to Embodiments 1 to 6. The first signal 371 is the inverse of this clock signal CK.

When the first signal 371 goes low, data is read from the first memory 353, and this first data 379 is confirmed after a predetermined delay period has elapsed (point C). In this case, the second signal 372 that is the output from the first equivalent circuit 354 goes low at the same time that the first data 379 is confirmed, or slightly later (point D). The second signal 372 is input to the second memory 355 and, when the second signal 372 goes low, a data read is performed by the second memory 355, using the first data 379 as an address signal. After a predetermined delay period has elapsed, the second data 380 is confirmed (point E). The second signal 372 is also input to the second equivalent circuit 356, and the third signal 373 that is the output from the second equivalent circuit 356 goes low at the same time that the second data 380 is confirmed, or slightly later (point F). When the third signal 373 goes low, the second data 380 is written to the storage device 357.

When the first signal 371 goes high (point C), the first memory 353 switches to precharging. When the first signal 371 goes high in this Embodiment 7, the second and third signals 372 and 373 also go high (points H and I), and this causes the second memory 355 and the storage device 357 to switch to precharging. However, it should be noted that this precharging is only necessary if the first and second memories 353 and 355 and the storage device 357 have a precharge function. If, for example, the storage device 357 is configured of a latch circuit comprising D flip-flops, there is no need for the storage device 357 to perform precharging, and thus it is not a necessary for the third signal 373 to go high. Note that in this case, the third signal 373 would act as a fetch signal for latching the second data 380 in the storage device (latch circuit) 357.

The provision of the first and second equivalent circuits in accordance with Embodiment 7 makes it possible to provide autonomous control over adjustments in the timing of operations such as data read and precharging. Therefore, it is no longer necessary to generate different control signals for timing adjustment, as in the prior-art example, and reading and precharging can be performed within one period of the clock signal, without waste, enabling huge reductions in circuit size and power consumption Embodiment 8

Figure 11:
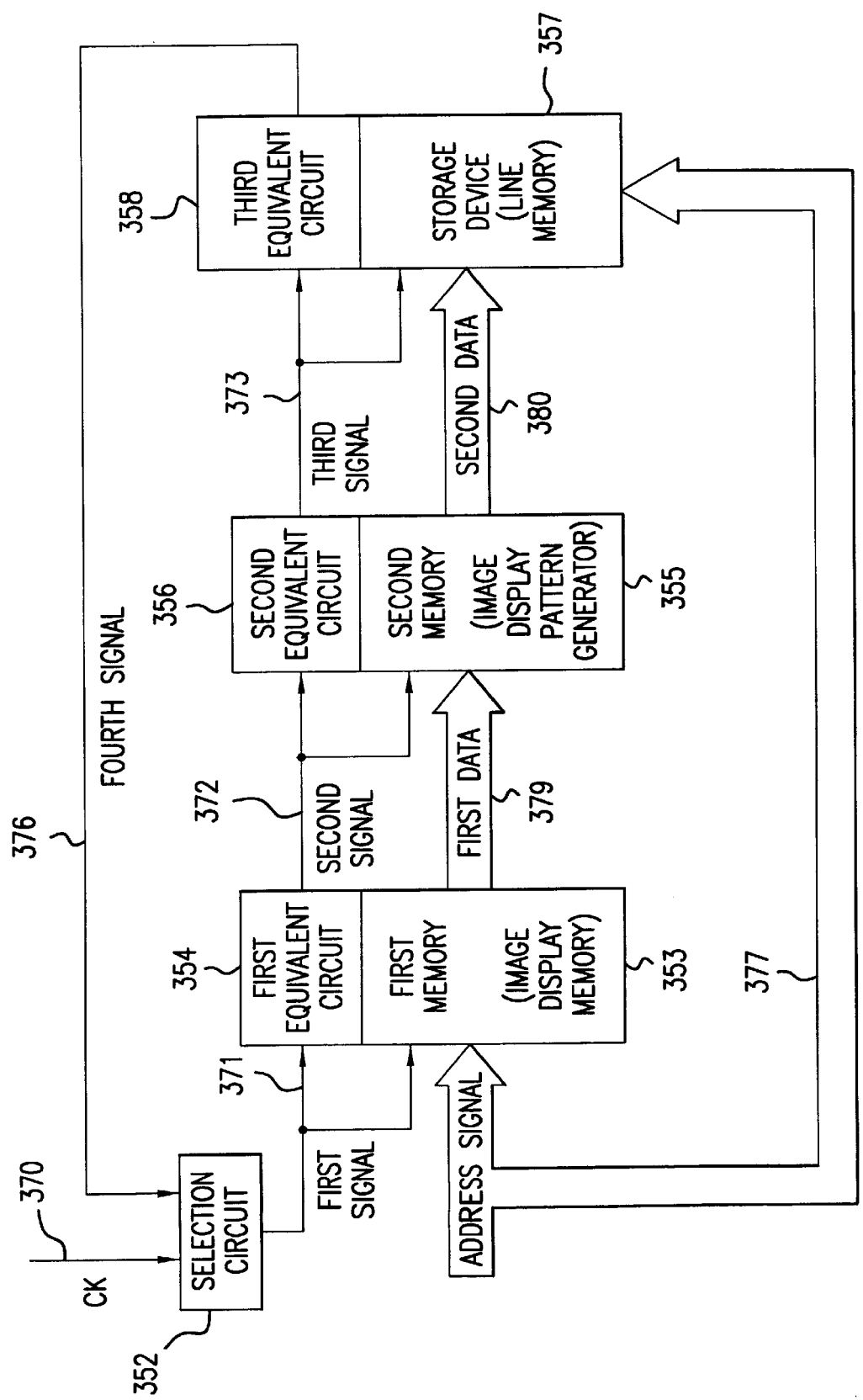
FIG. 11 shows the configuration of a display data processing device of Embodiment 8.

The configuration of a display data processing device in accordance with an eighth embodiment of this invention is shown in FIG. 11. This embodiment differs from Embodiment 7 in that a third equivalent circuit 358 and a selection circuit 352 are additionally provided. The third equivalent circuit 358 is designed to output a fourth signal 376 based on the third signal 373, and the fourth signal 376 reaches the enabled level at the point at which the second data 380 is written to the storage device 357, or thereafter. The selection circuit 352 generates the first signal 371 on the basis of the input fourth signal 376 and a clock signal CK 370, and outputs this signal to the first memory 353 and the first equivalent circuit 354. More specifically, the first signal goes to the disabled level (such as high) when the fourth signal 376 reaches the enabled level. This preferably sets the second signal 372 and third signal 373 to the disabled level. When the first, second, and third signals 371, 372, and 373 reach the disabled level, the first and second memories 353 and 355 and the storage device 357 switch to precharging.

Figure 12:
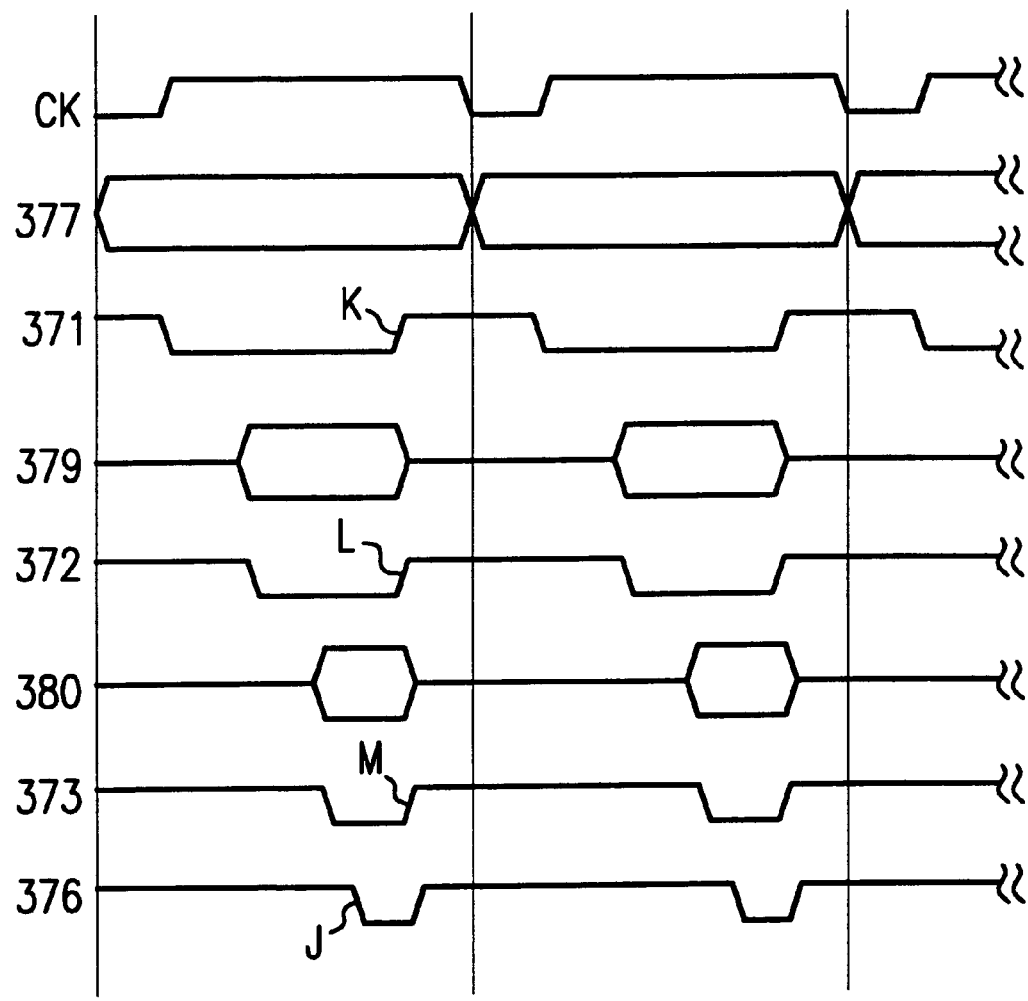
FIG. 12 is a timing chart illustrating the operation of Embodiment 8.

A timing chart used to illustrate the operation of Embodiment 8 is shown in FIG. 12. This operation differs from that of Embodiment 7 shown in FIG. 10 in that the fourth signal 376 goes low when the data write to the storage device 357 ends (point J of FIG. 12), this makes the first to third signals 371 to 373 go high (points K, L, and M, respectively), and thus the first and second memories 353 and 355 switch to precharging.

If the second data 380 is written to the storage device 357, it does not matter how the first data 379 and the second data 380 are changed thereafter. On the other hand, it is preferable that the switch to precharging occurs as soon as possible after data is read, in order to reduce power consumption and speed up the operation. With Embodiment 8, the fourth signal 376 is set to the enabled level at the point at which data has been written to the storage device 357, or thereafter. Since this sets the first to third signals 371 to 373 to the disabled level and switches the first and second memories 353 and 355 and the storage device 357 to precharging, it enables a huge reduction in power consumption and increase in operating speed. Thus Embodiment 8 enables autonomous control over not only the reading operation, but also over precharging.

Embodiment 9

Figure 13:
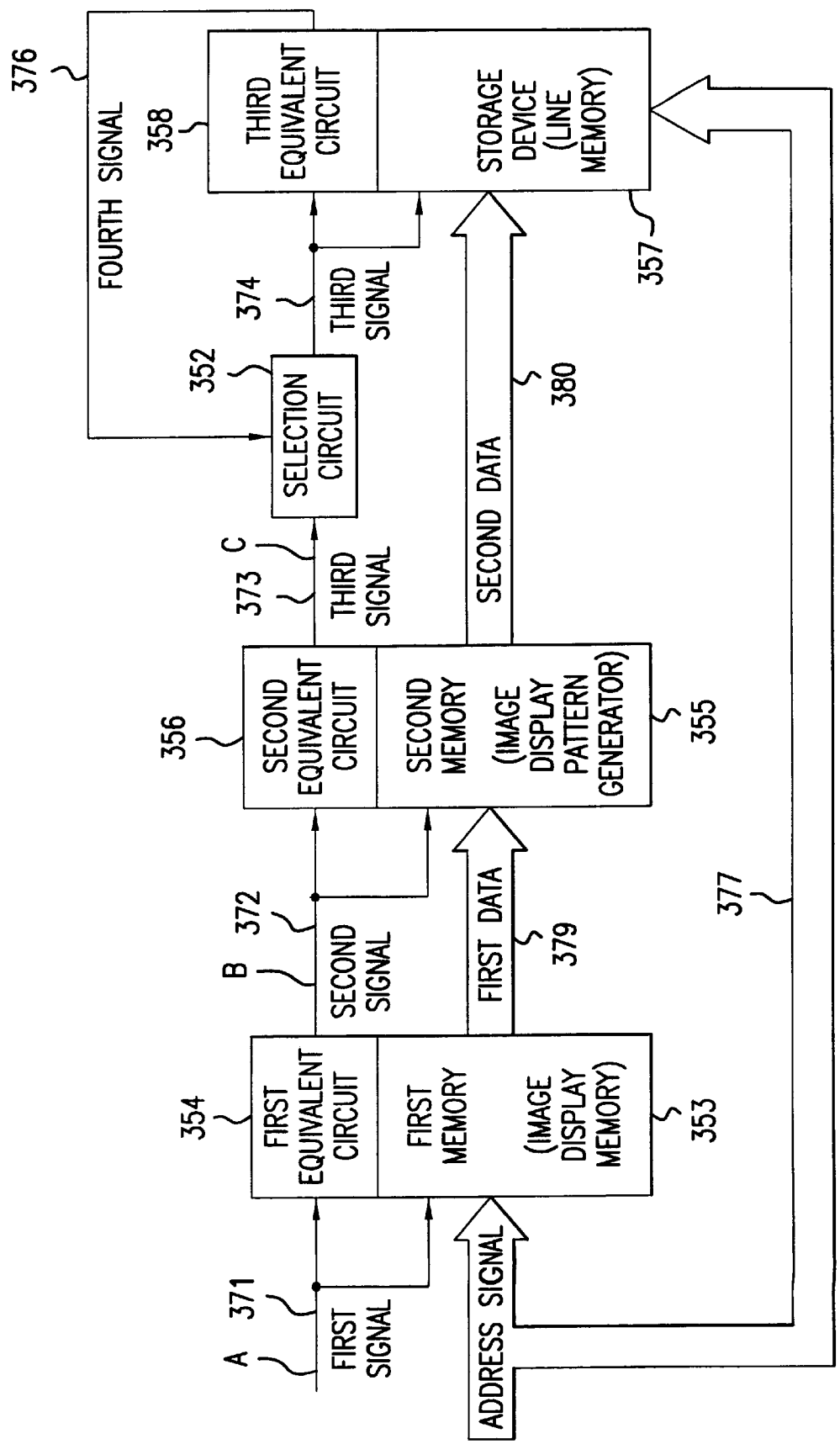
FIG. 13 shows the configuration of a display data processing device of Embodiment 9.

The configuration of a display data processing device in accordance with a ninth embodiment of this invention is shown in FIG. 13. This embodiment differs from Embodiment 8 in that the selection circuit 352 is placed between the second equivalent circuit 356 and the third equivalent circuit 358. This ensures that the fourth signal 376 that is the output of the third equivalent circuit 358 reaches the enabled level and a third' signal 374 that is the output of the selection circuit 352 reaches the disabled level at that point at which the second data 380 has been written to the storage device 357 (or thereafter), This causes the storage device 357 to switch to precharging. In other words, the write operation ends automatically at the point at which data has been written to the storage device 357, before the first and second memories 353 and 355 are made to precharge by the first and second signals 371 and 372. This enables an earlier switching of the storage device 357 to precharging, reducing the power consumption and speeding up the operation.

Note that the selection circuit 352 is not limited to the locations shown in FIGS. 11 and 13; it can be placed in various other locations. That is, the selection circuit 352 may be placed in at least one of the locations indicated by A, B, and C in FIG. 13, or selection circuits may be placed in two locations, or all three. A configuration in which selection circuits are provided in all three locations A, B, and C is disadvantageous from the circuit size point of view, but it would be advantageous in reducing power consumption and increasing the operating speed.

Figure 14:
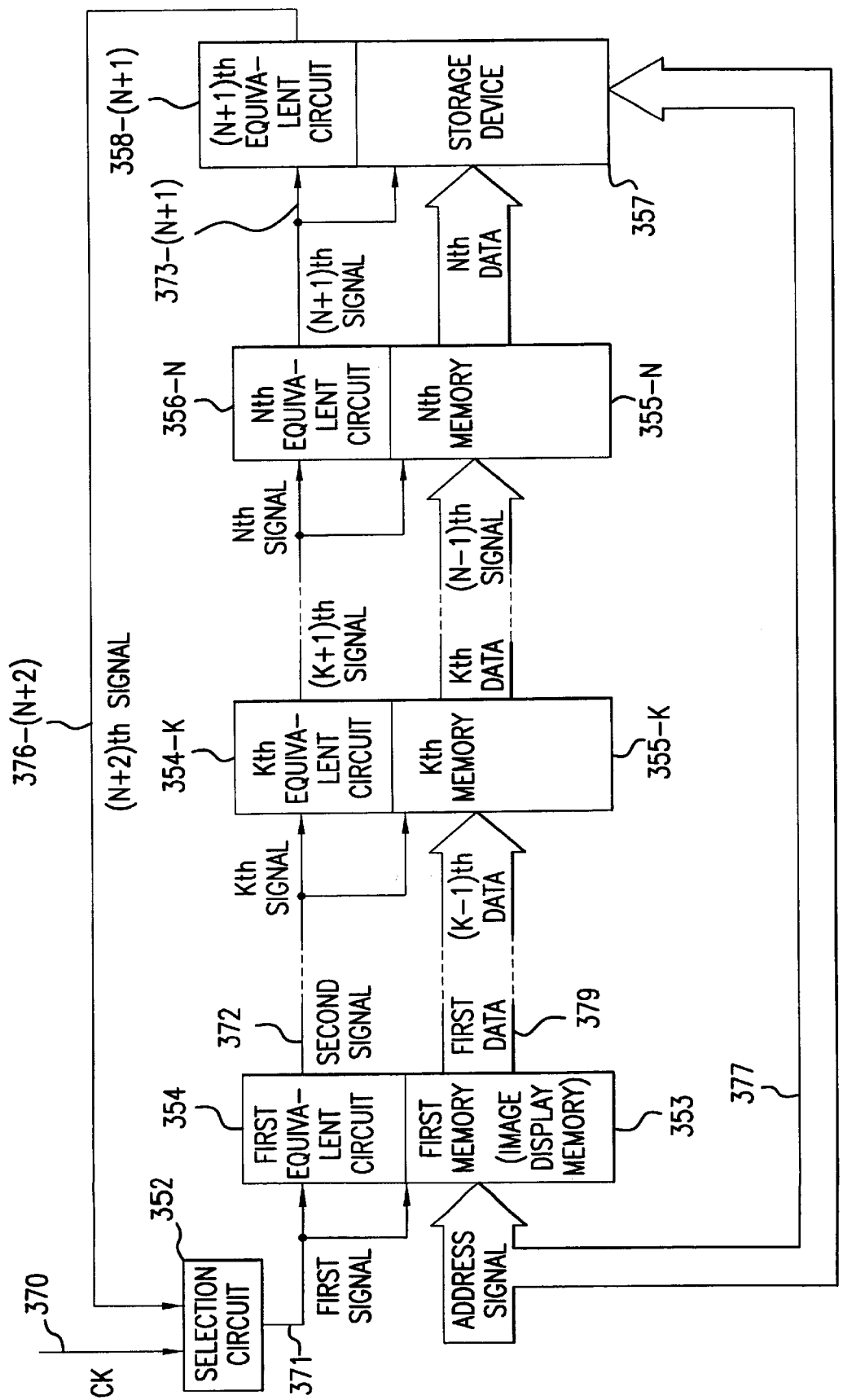
FIG. 14 shows an example of the configuration in which the display data processing device comprises N memories.

Note also that the display data processing devices of Embodiments 7 to 9 were described above as including two memories by way of example, but this invention is not limited thereto; a display data processing device having three or more memories would still be within the scope of this invention. An example of the configuration in which Embodiment 8 (see FIG. 11) comprises N memories is shown in FIG. 14. In this figure, N and K are integers such that 1<K≦N. Each of the display data processing devices of Embodiments 7 and 9, as well as those of Embodiments 10 to 12 that will be described below, may have the same configuration as that shown in FIG. 14, comprising N memories.

Embodiment 10

Figure 15:
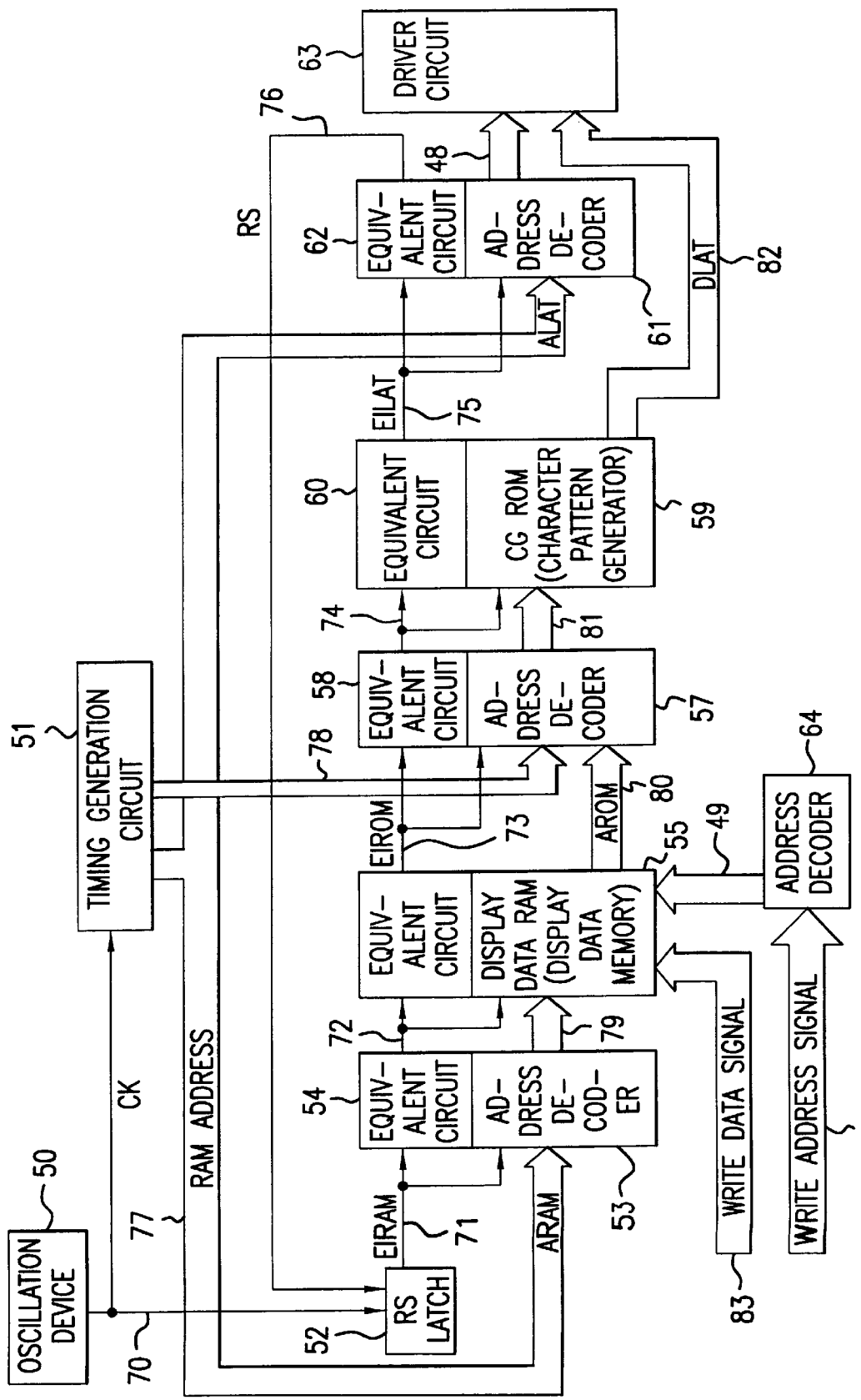
FIG. 15 shows the configuration of a display data processing device of Embodiment 10.

A tenth embodiment of this invention illustrates a further specific example of a display data processing device, with the configuration thereof being as shown in FIG. 15.

The description below concerns the application of this invention to a display data processing device provided with a character pattern generator, which is a typical example of a display data processing device. In this case, a display data RAM (a display data memory) 55, a CGROM (a character pattern generation circuit) 59, and a driver circuit 63 correspond to the first memory, second memory, and storage means, respectively, of Embodiments 7 to 9.

The display data RAM 55 stores one screen)s worth of character code signals sent from devices such as a microcontroller and a processor. The CGROM 59 generates character patterns corresponding to these character code signals. The driver circuit (signal drive circuit) 63 has a latch function for storing character pattern signals during one horizontal period in a time-division manner. Using this display data processing device, a character pattern or the like is displayed on a dot-matrix panel comprising a plurality of signal electrodes driven by the driver circuit 63 and a plurality of scan electrodes driven sequentially by a scan drive circuit and intersecting the signal electrodes.

Consider a case in which N×M characters are displayed on the dot-matrix panel, where each character is configured of n×m dots. Assume that 1C (1 character) is the time taken by the series of operations required for transferring the data for one line of pixels (1 dot line) in one character from the display data RAM 55 to the driver circuit 63 through the CGROM 59. Assume also that the data output from the CGROM 59 is n bits wide. In such a case, a period of N×1C is one dot line period (1H) and a period of M×m×N×1C is one frame period (1FR).

Display data from the microcontroller and processor to the display data RAM 55 is written on the basis of a write data signal 83 and an address signal 49 (a write address signal 84 decoded by an address decoder 64).

A clock signal 70 output by an oscillation device 50 is input to a timing generation circuit 51. The timing generation circuit 51 generates a RAM address signal 77 and a CGROM address signal 78 that are essential control signals. The display data RAM 55 is a type of frame memory in which character (display) codes are stored. Character pattern data (display data) corresponding to the character codes in the display data RAM 55 is stored in the CGROM 59. The driver circuit 63 latches and accumulates character pattern data 82 that is output from the CGROM 59. Liquid crystal drive voltages corresponding to the thus accumulated character pattern data are sent to a liquid crystal panel (not shown), thereby causing an image to be displayed on the liquid crystal panel.

Figure 16:
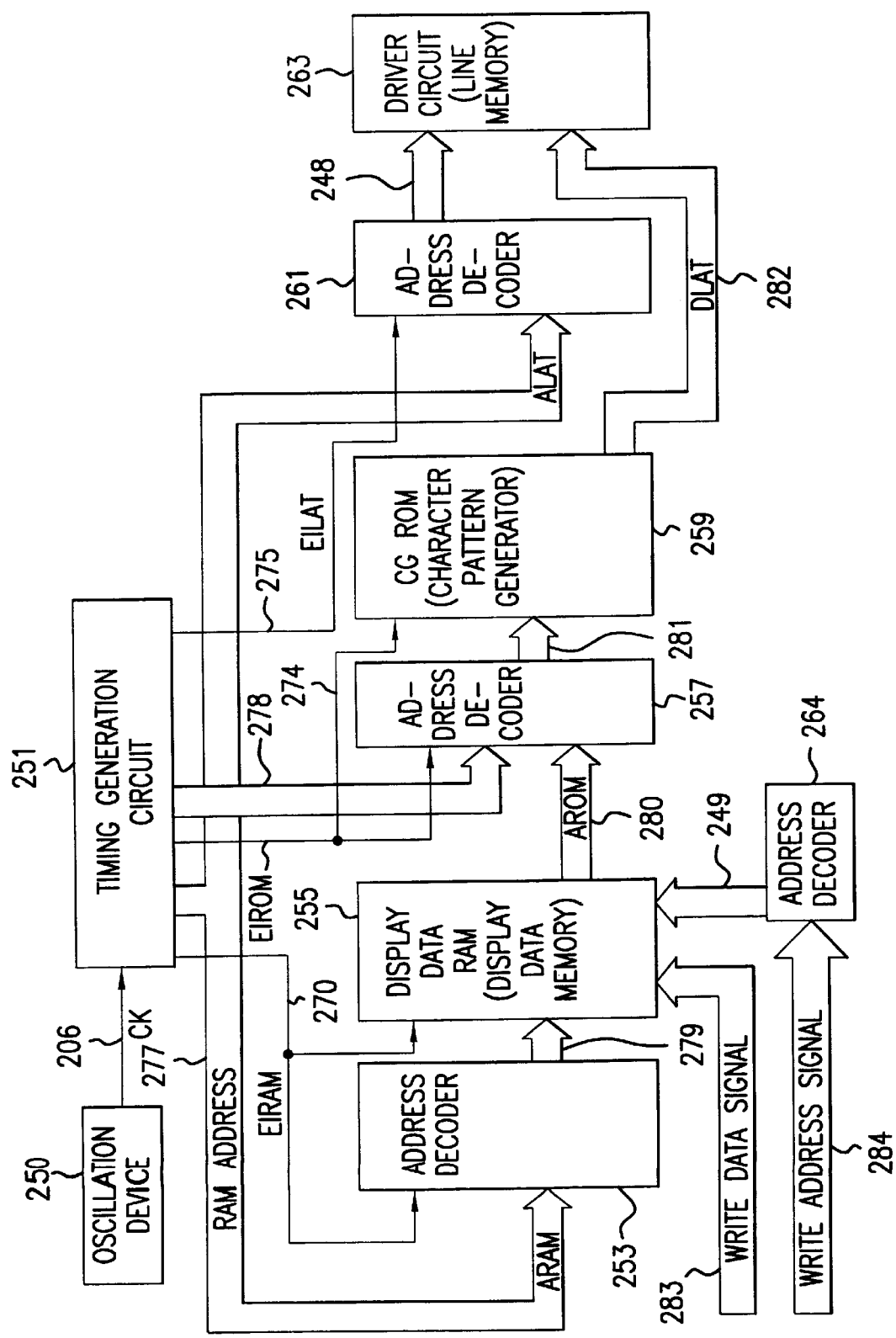
FIG. 16 shows a comparative example of the configuration of a display data processing device using a prior-art method.
Figure 37A:
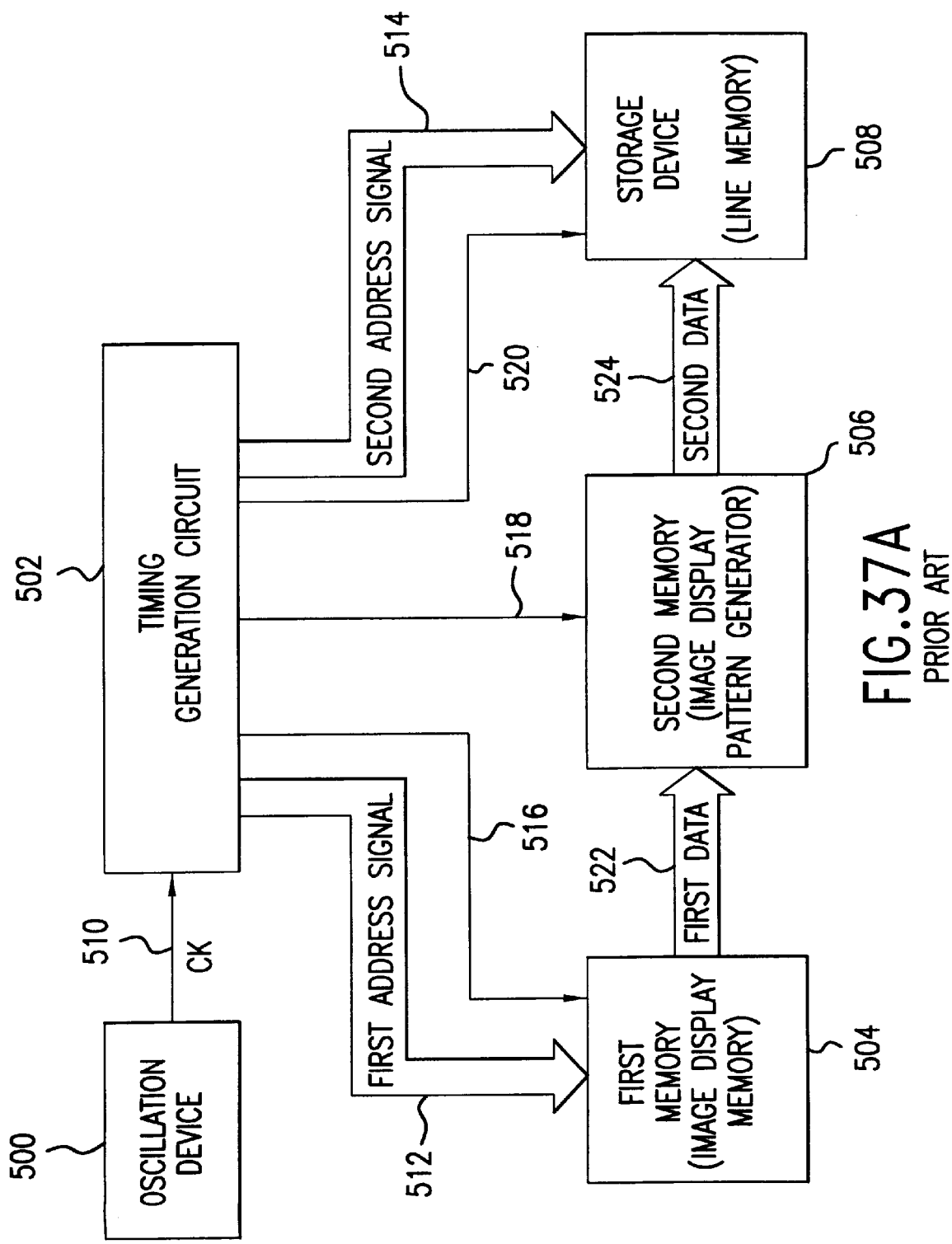
FIG. 37A shows an example of the configuration of a prior-art display data processing device and FIG. 37B is a timing chart thereof.
Figure 37B:
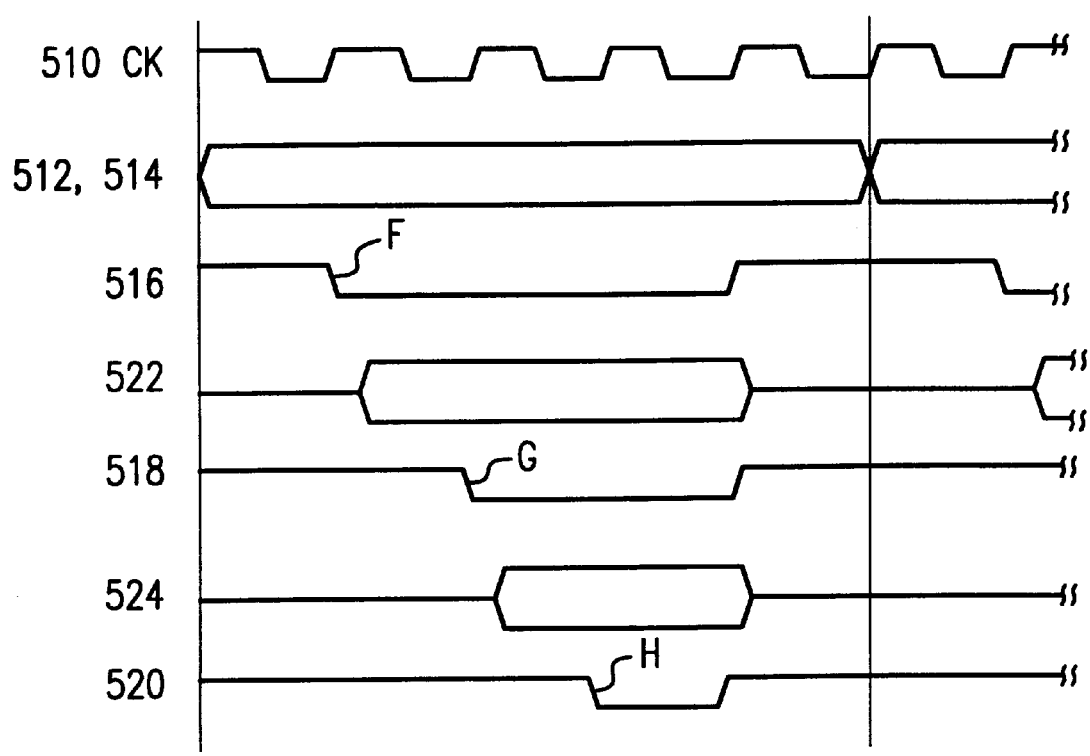

A comparative example of a display data processing device configured in accordance with a prior-art method (see FIG. 37A) is shown in FIG. 16.

Embodiment 10 (see FIG. 15) and this comparative example differ in that an address decoder 53, the display data RAM 55, another address decoder 57, the CGROM 59, and a further address decoder 61 of Embodiment 10 are provided with equivalent circuits 54, 56, 58, 60, and 62, respectively, which are dummy circuits.

In the comparative example, a timing generation circuit 251 generates signals 270, 274, and 275 for reading and precharging an address decoder 253, a display data RAM 255, another address decoder 257, a CGROM 259, and a further address decoder 261. In contrast thereto, these signals are not generated in Embodiment 10. Instead, the clock signal 70 output by the oscillation device 50 of Embodiment 10 is input to an RS latch circuit 52, and an output 71 of this RS latch circuit 52 is input to the equivalent circuit 54 of the address decoder 53. An output 72 of the equivalent circuit 54 passes through the equivalent circuits 56, 58, 60, and 62 to become a precharge signal 76, and this precharge signal 76 is fed back to the RS latch circuit 52.

The description now turns to the operation of reading display data in Embodiment 10.

The address signal 77 for the display data RAM 55 is generated by the timing generation circuit 51 on the basis of the clock signal 70 output from the oscillation device 50 and is input to the address decoder 53 for the display data RAM. This clock signal 70 passes through the RS latch circuit 52 also input to the address decoder 53 and the equivalent circuit 54 as a read signal 71. A read signal 72 and the address signal 79 are output simultaneously from the equivalent circuit 54 and the address decoder 53 (the signal 72 may lag behind the signal 79). In this case, the read signal 71 is enabled (active) when low and it goes low when the clock signal 70 goes low.

An address is set for the display data RAM 55 by the read signal 72 corresponding to the state of the decoded address signal 79. In this case, the read signal 72 is delayed from the read signal 71 by the time required for decoding the address. When the read signal 72 goes low, a character code signal 80 and a read signal 73 for the CGROM are output simultaneously (the signal 73 may lag behind the signal 80).

The CGROM address decoder 57 decodes the address according to the states of the character code signal 80 and the address signal 78, then outputs an address signal 81 to the CGROM 59. In this case, a read signal 74 is output simultaneously with the address signal 81 (the signal 74 may lag behind the signal 81) and is delayed from the read signal 73 by the time required for decoding the address. Next, the character pattern data 82 prompted by the read signal 74 are output simultaneously with a read signal 75 (the signal 75 could lag behind the signal 82).

The address decoder 61 for the driver circuit decodes the address according to the state of the address signal 77, then outputs a translated address signal (fetch signal) 48 to the driver circuit 63. This sets the address in the driver circuit 63 and also latches and accumulates the character pattern data 82 in the driver circuit 63. At this point, the precharge signal 76 and the translated address signal 48 are output simultaneously (the signal 76 may lag behind the signal 48).

The precharge signal 76 is fed back to the RS latch circuit 52. The address decoder 53, the display data RAM 55, the address decoder 57, the CGROM 59, and the address decoder 61 start precharging in sequence. Thus, the signals 71, 72, 73, 74, and 75 act as precharge signals and display data can be read out by repeating these reading and precharging operations.

Figure 17:
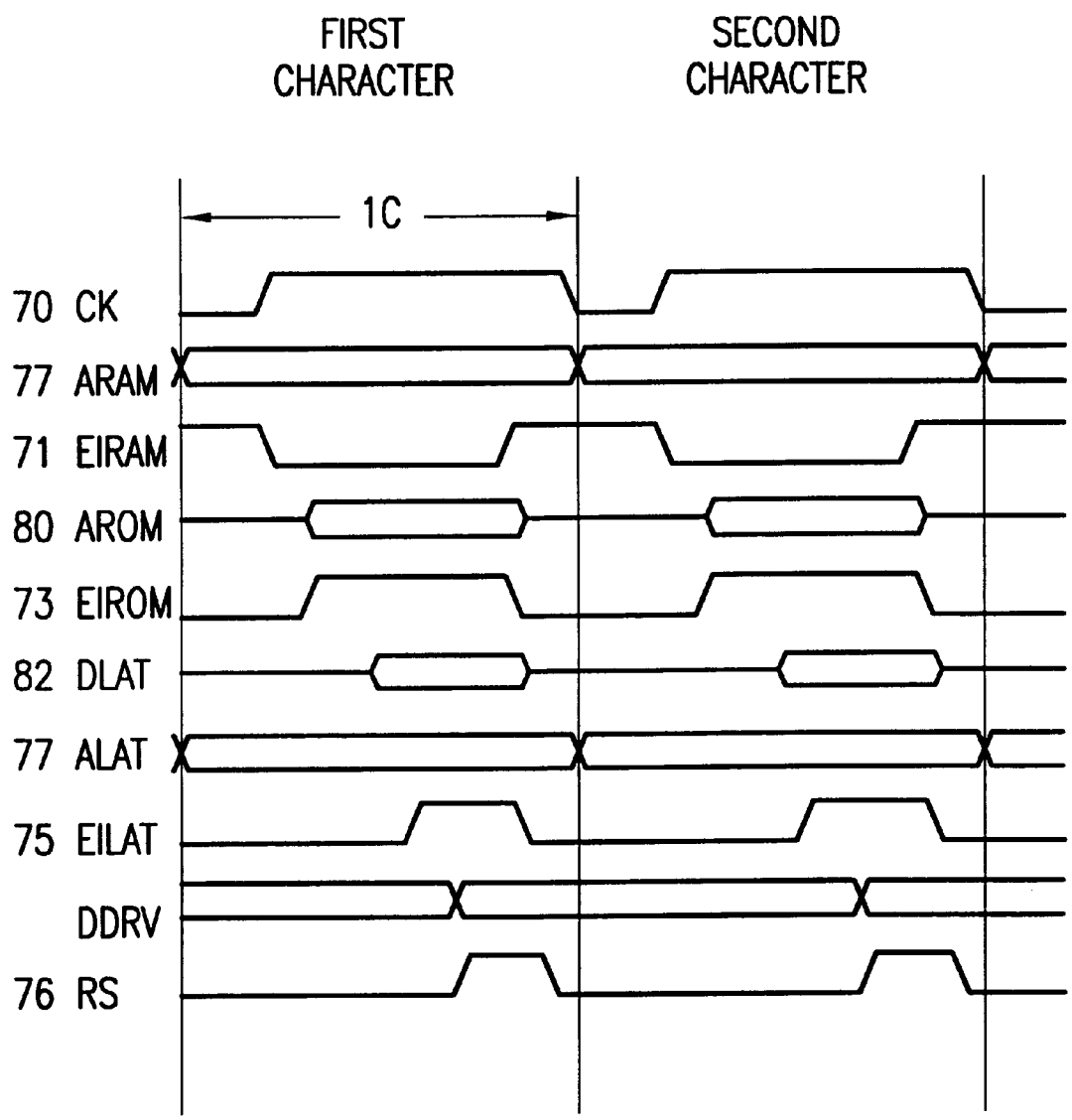
FIG. 17 is a timing chart illustrating the operation of Embodiment 10.

A timing chart used to illustrate the operation of Embodiment 10 is shown in FIG. 17.

Assume that the clock signal 70 is CK, the signal 71 that acts as a reading and precharging signal for the display data RAM 55 is EIRAM, and the address signal 77 is ARAM. Assume also that the character code signal 80 that acts as an address signal for the CGROM 59 is AROM and the signal 73 that acts as a reading and precharging signal for the CGROM 59 is EIROM. Assume further that the RAM address signal 77 of the driver circuit 63 is ARAT, the signal 75 that acts as a writing and precharging signal for the driver circuit 63 is EILAT, and the character pattern data 82 that acts as input data is DLAT. The waveform of the signal accumulated in the driver circuit 63 is DDRV. In this case, reading occurs when EIRAM goes low and precharging occurs when it goes high. Similarly, reading occurs when either of EIROM and EILAT goes high, and precharging occurs when they go low. The timing generation circuit 51 does not generate EIRAM, EIROM, and EILAT; each of the circuits operates under autonomous control. This means that the timing generation circuit needs only generate the address signals ARAM (77) and ALAT (77), at the same timing.

Figure 18:
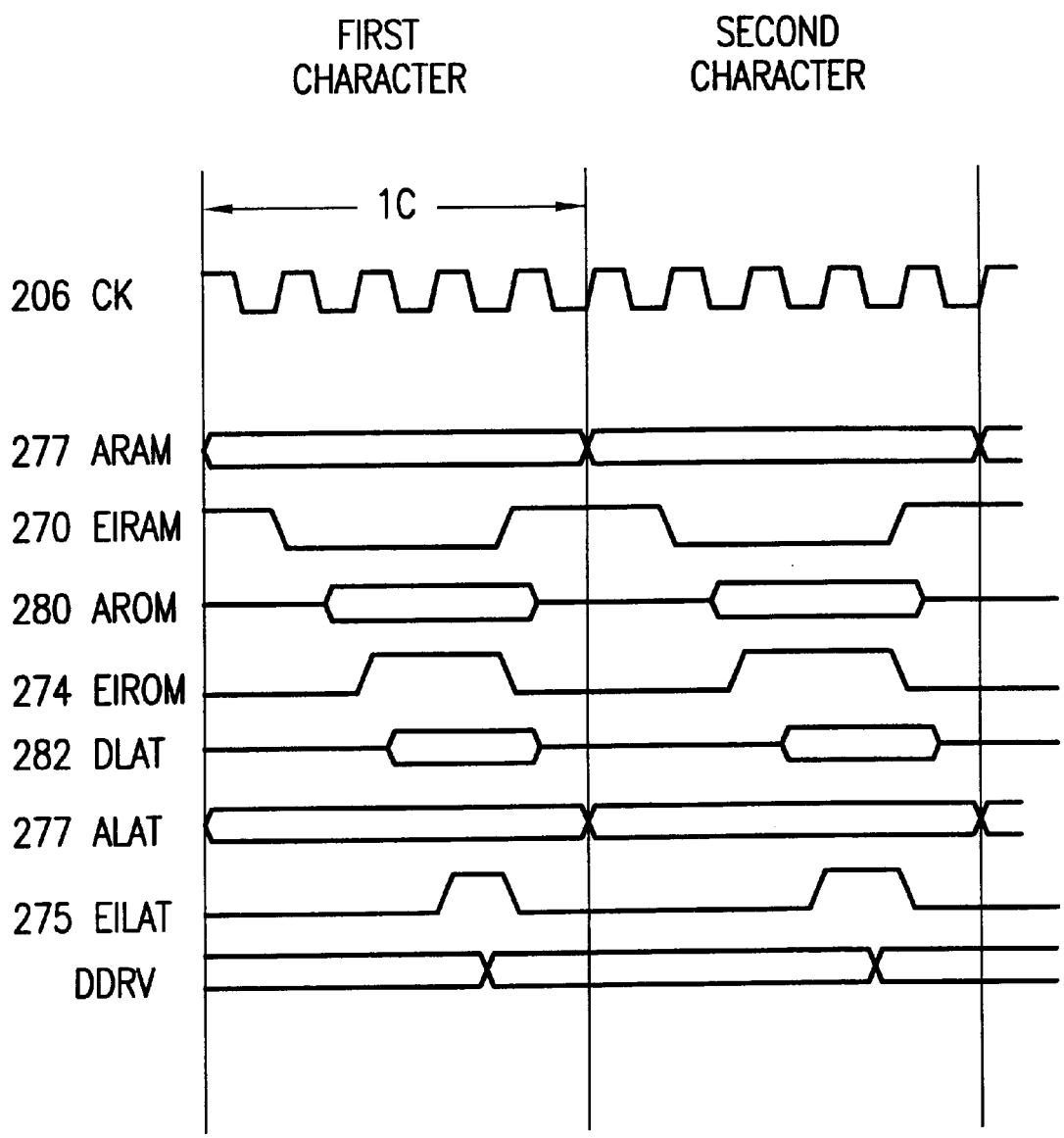
FIG. 18 is a timing chart illustrating the operation of the comparative example.

Note that a timing chart of the comparative example is shown in FIG. 18. As should be understood from a comparison of FIGS. 17 and 18, the high-frequency clock that is required by the comparative example is not necessary in Embodiment 10, and thus the configuration of Embodiment 10 can reduce power consumption. Since it is also unnecessary for the timing generation circuit 51 of Embodiment 10 to generate signals such as EIROM and EILAT, the size of the circuitry can be reduced and the operating speed can be increased.

Figure 19:
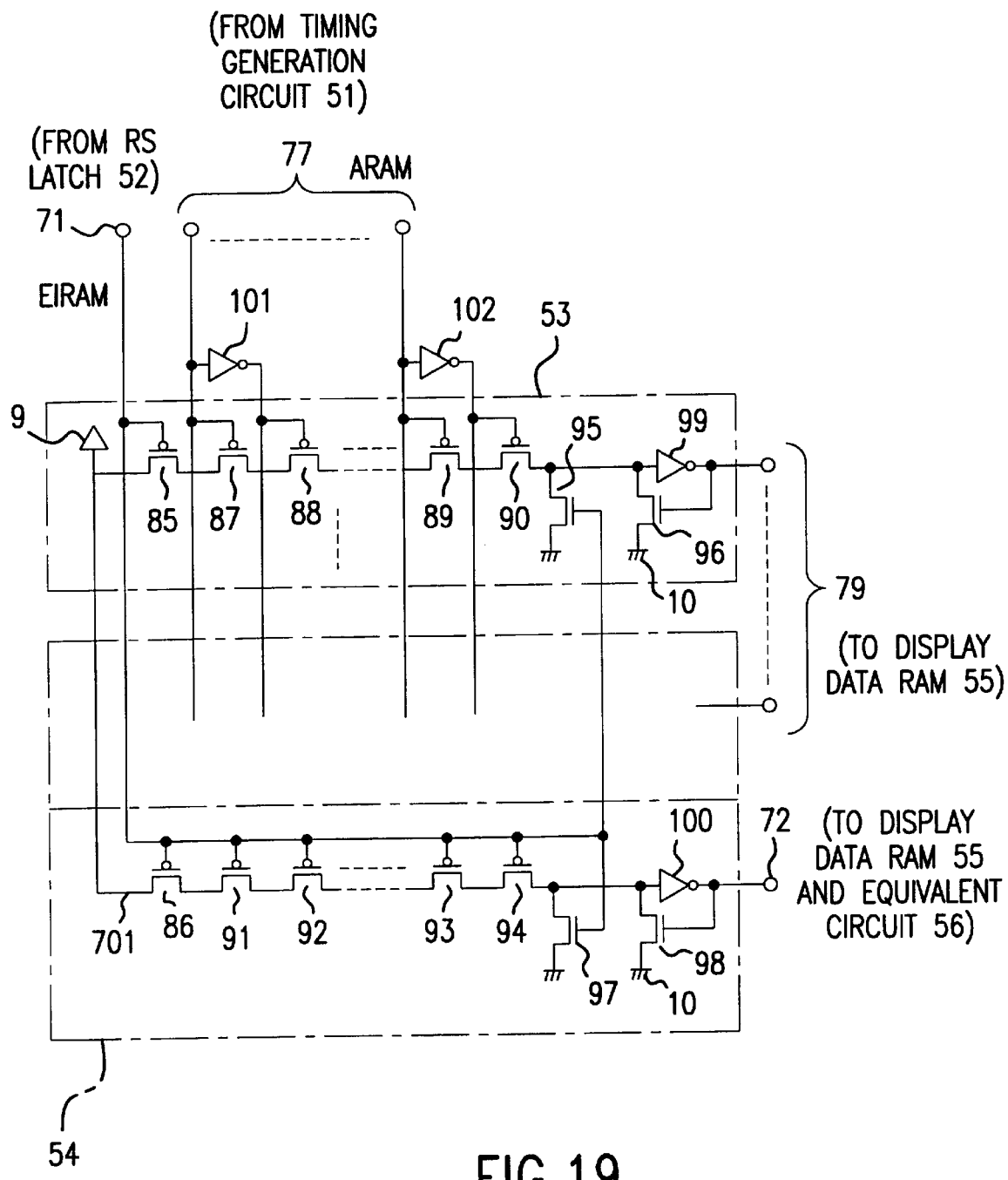
FIG. 19 shows an example of the configuration of an address decoder for the display data RAM and the equivalent circuit thereof.

Examples of detailed circuit configurations of the address decoders 53, 57, and 61, the display data RAM 55, the CGROM 59, and the equivalent circuits 54, 58, 60, and 62 will now be described. First of all, a specific example of the address decoder 53 and the equivalent circuit 54 thereof is shown in FIG. 19.

MOS transistors 87 to 90 configure a series-connected ROM. The drain and source regions of each transistor are short-circuited to indicate an absence of data (such as a data value 0) or not short-circuited to indicate a presence of data (such as a data value of 1). Switching between the short-circuited state and the non-short-circuited state can be implemented by means such as a metal switching method or an ion implantation method (field switching), in the same manner as with a mask ROM. Data read from the series-connected ROM is controlled by a MOS transistor 85 and signals from the series-connected ROM are amplified by a MOS inverter 99. A MOS transistor 95 provides precharging and another MOS transistor 96 is for potential-fixing. The equivalent circuit 54 of the address decoder 53 is configured to be equal to sufficient ROM for one address line of the address decoder 53 (one line within the address signal 79), and is distinguished in that MOS transistors 91 to 94 are controlled by the read signal 71.

One of the address lines corresponding to the state of the address signal 77 (one line within the address signal 79) is selected and the address of the address signal 77 is decoded thereby. When the EIRAM signal 71 then goes low, a signal that is the decoded address is output to the display data RAM 55 as the translated address signal 79. This causes the equivalent circuit 54 of the address decoder 53 to simultaneously output the read signal 72 of the display data RAM 55. At this point, at least the same number of transistors as those connected to those of the address lines that have the largest delay are connected to a line 701. This ensures that the read signal 72 is output simultaneously with the translated address signal 79, or thereafter.

Figure 20:
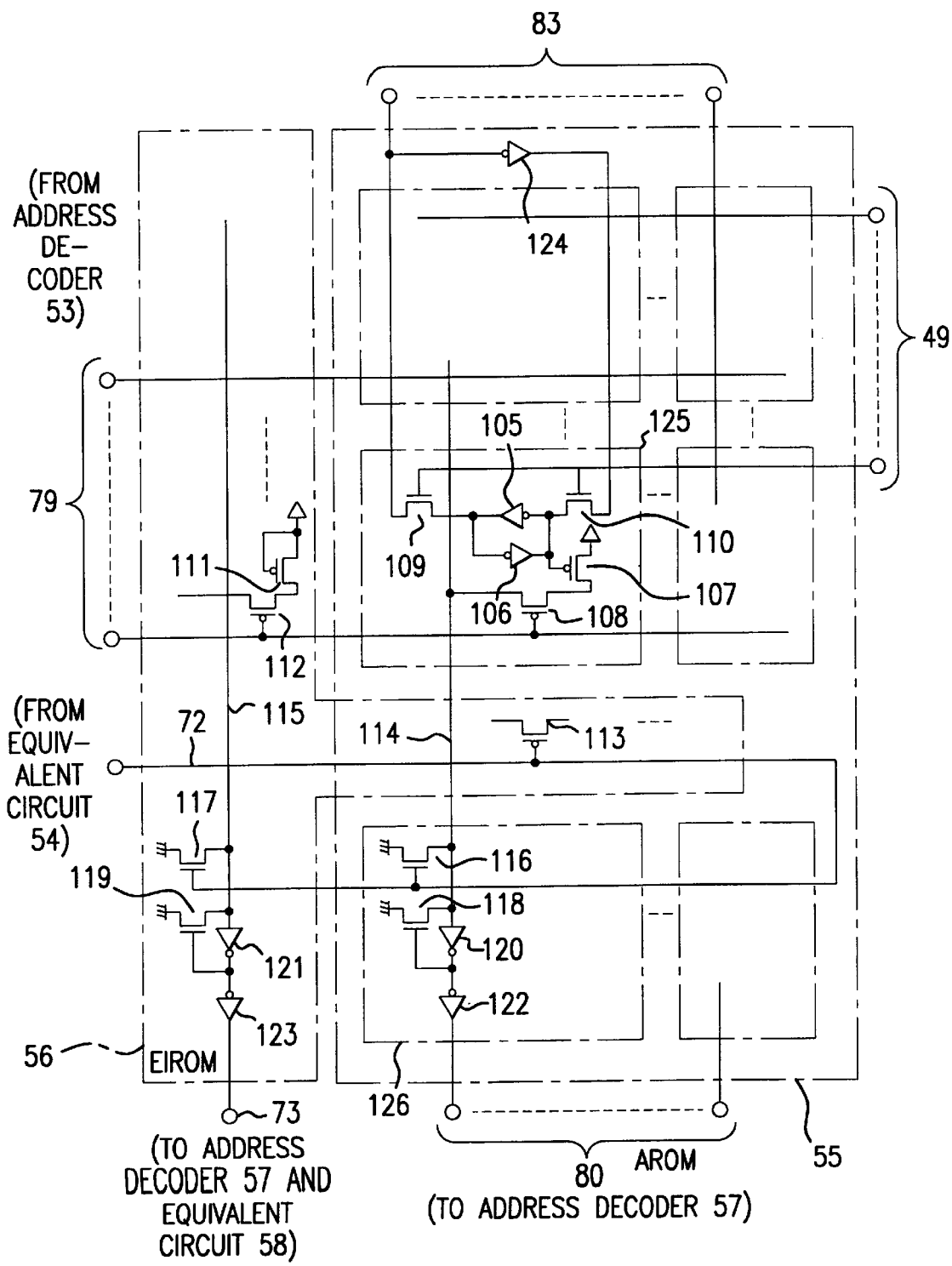
FIG. 20 shows another example of the configuration of an address decoder for the display data RAM and the equivalent circuit thereof.

Details of the circuit configuration of the display data RAM 55 and the equivalent circuit 56 will now be described with reference to FIG. 20.

A 1-bit RAM cell 125 is configured of MOS inverters 105 and 106, MOS transistors 109 and 110 for data write, and MOS transistors 107 and 108 for data read. A RAM output cell 126 comprises a precharging MOS transistor 116, a potential-fixing MOS transistor 118, and MOS inverters 120 and 122 for to amplifying a data signal 114.

Another MOS transistor 113 is equivalent to the MOS transistor 108 within the RAM cell 125, and MOS transistors 111 and 112 are equivalent to the MOS transistors 107 and 108 within the RAM cell 125. MOS transistors 117 and 119 and MOS inverters 121 and 123 are equivalent to the RAM output cell 126. The equivalent circuit 56 comprises the transistors 111, 112, 113, 117, and 119 and the MOS inverters 121, 123. The address signal 79 and the read signal 72 are output simultaneously from the address decoder 53 and the equivalent circuit 54 and are input simultaneously to the display data RAM 55 and the equivalent circuit 56, causing the EIROM signal 73 and character code signal (AROM) 80 to be output simultaneously. Thus the EIROM signal 73 provides autonomous timing adjustment by the equivalent circuit 56 of the display data RAM 55.

In this case, the data signal 83 and address signal 49 are used for writing to the display data RAM. Note that, since this Embodiment 10 uses a dual-port RAM, reading and writing can be operated independently.

Figure 21:
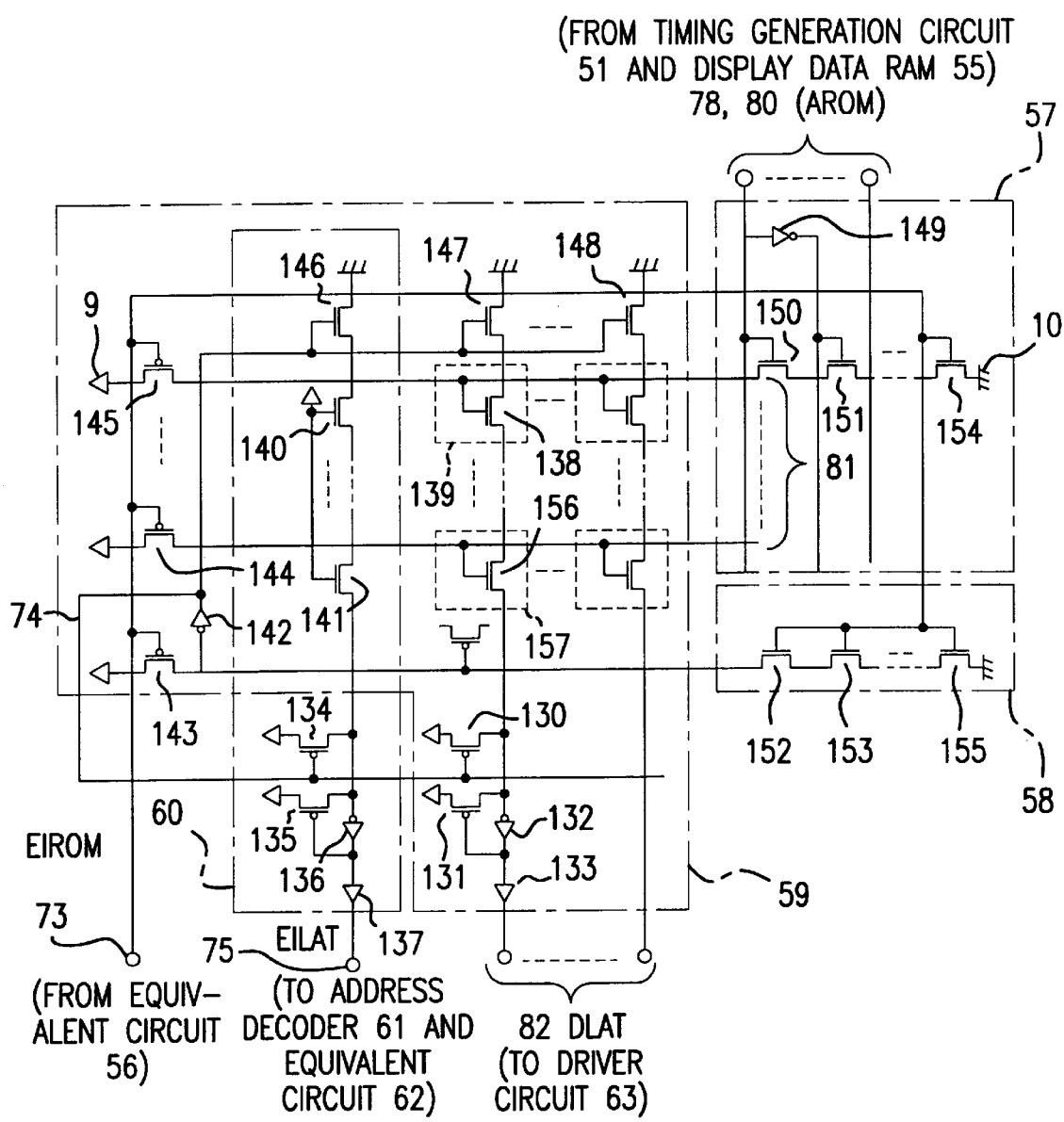
FIG. 21 shows an example of the configuration of the CGROM address decoder, the CGROM, and the equivalent circuits thereof.

Details of the circuit configuration of the address decoder 57, the CGROM 59, and the corresponding equivalent circuits 58 and 60 will now be described, with reference to FIG. 21.

A ROM cell 139 comprises a MOS transistor 138. A MOS transistor 130 provides precharging, another MOS transistor 131 is for potential-fixing, MOS inverters 132 and 133 amplify data signals, and these components configure an output cell of the CGROM 59, A MOS transistor 147 provides read control.

The address decoder 57 for the CGROM 59 comprises MOS transistors 150, 151, and 154, and the basic configuration thereof is the same as that of the address decoder 53 for the display data RAM (see FIG. 19).

MOS transistors 152, 153, and 155 are equivalent to the MOS transistors 150, 151, and 154 of the address decoder 57, and the equivalent circuit 58 is configured of these MOS transistors 152, 153, and 155.

A MOS transistor 146 is equivalent to the MOS transistor 147, and MOS transistors 140 and 141 are equivalent to the MOS transistors 138 and 156 within ROM cells 139 and 157. MOS transistors 134 and 135 and MOS inverters 136 and 137 are equivalent to the MOS transistors 130 and 131 and MOS inverters 132 and 133 within the output cell of the CGROM 59. The equivalent circuit 60 is configured of these MOS transistors 146, 140, 141, 134, and 135 and the MOS inverters 136 and 137.

The character code signal (AROM) 80 and the EIROM signal 73 that are output simultaneously from the display data RAM 55 and the equivalent circuit 56 thereof and are input simultaneously to the CGROM address decoder 57 and the equivalent circuit 58 thereof, causing the character pattern data (DLAT) 82 and the EILAT signal 75 to be output simultaneously through the CGROM 59 and the equivalent circuit 60 thereof. Thus the EILAT signal 75 provides autonomous timing adjustment by the equivalent circuit 58 of the address decoder 57 and the equivalent circuit 60 of the CGROM 59.

Figure 22:
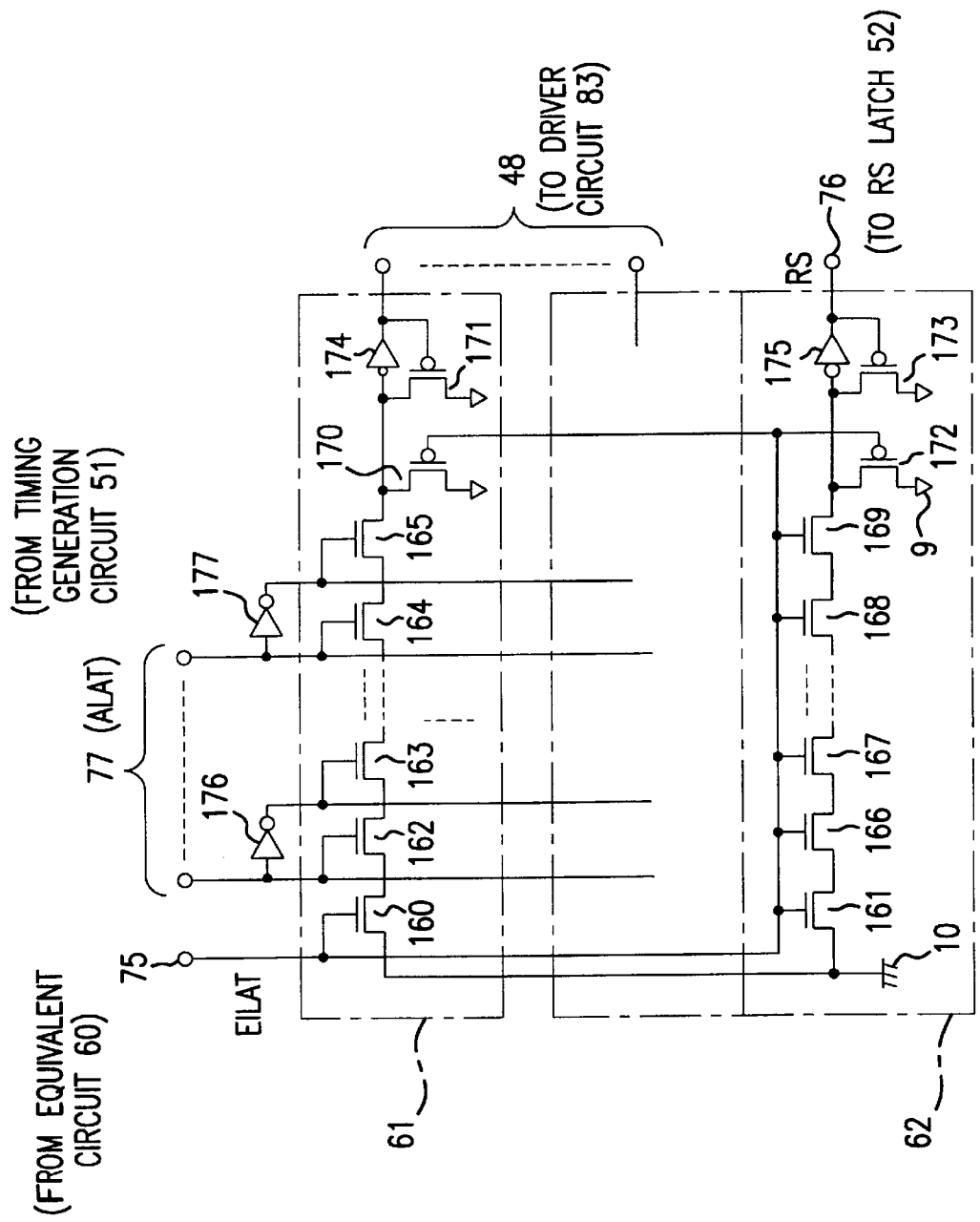
FIG. 22 shows an example of the configuration of the driver circuit address decoder and the equivalent circuit thereof.

Details of the circuit configuration of the address decoder 61 and the equivalent circuit 62 will now be described with reference to FIG. 22.

MOS transistors 162 to 165 configure a series-connected ROM. Data read from the series-connected ROM is controlled by a MOS transistor 160 and signals from the series-connected ROM are amplified by a MOS inverter 174. A MOS transistor 170 provides precharging and another MOS transistor 171 is for potential-fixing. The equivalent circuit 62 is configured to be equal to sufficient ROM for one address line of the address decoder 61, and is distinguished in that MOS transistors 166 to 169 are controlled by the read signal 75.

One of the address lines corresponding to the state of the address signal 77 (one line within the translated address signal 48) is selected and the address of the address signal 77 is decoded thereby. When the EILAT signal 75 then goes high, a signal that is the decoded address is output to the driver circuit 63 as the translated address signal 48. The previously output character pattern data (DLAT) 82 is latched and accumulated in the driver circuit 63 based on this translated address signal (equivalent to a fetch signal) 48. The equivalent circuit 62 simultaneously outputs a precharge signal RS 76 to the RS latch circuit 52. In other words, the RS signal 76 enables autonomous timing adjustment by the equivalent circuit 62.

A specific example of the configuration of the RS latch circuit 52 will now be described with reference to FIG. 23.

The RS latch circuit 52 comprises NAND circuits 180, 181, and 182 and a MOS inverter 183. The clock signal CK 70 and the precharge signal RS 76 are both enabled (active) when high. In other words, when the CK signal 70 goes high, the EIRAM signal 71 goes low and data is read from the display data RAM 55 to the driver circuit 63. When the RS signal 76 (which is a signal indicating the end of this read) goes high, the EIRAM signal 71 goes high and precharging is started.

Note that the description of Embodiment 10 concerned a configuration of five equivalent circuits (54, 56, 58, 60, and 62), but a configuration in which the numbers of address decoders and memories are increased and six or more equivalent circuits are provided may equally well be used. Outputs from each address decoder/memory and the equivalent circuit has mainly been described above as occurring simultaneously, but the output from each equivalent circuit may be delayed until after the output from the corresponding address decoder and memory. In other words, it is preferable that the design of the equivalent circuits has a certain amount of margin to allow the output of the equivalent circuit to be delayed until after the output of the address decoder and memory, from considerations of variations in processing quality.

With this embodiment as described above, display data for one character in one horizontal dot line is read within one period of the clock signal CK 70 (a period of 1C). The series of operations from this reading of data until its latching can be controlled by using the clock signal CK 70 alone. This implements a configuration in which each circuit is provided with an equivalent circuit and the delay of the read signal that acts as a control signal is made to be the same as the delay of the data read itself. This makes it unnecessary to generate timing signals that take into account the access time for each circuit, and to use a high-frequency clock signal (of 3 to 5 times the frequency of the read signal). Assuming that the frequency of a CMOS circuit is f, the voltage thereof is V, and the load capacitance is C, the current consumption IDD thereof is given by: IDD=f×V×C. This means that the current consumption can be reduced to ⅓ to ⅕ of its original value by reducing the clock frequency. This embodiment enables a reduction in control circuitry, and also implements a reduction in current consumption by reducing the number of circuits and lowering the oscillation frequency.

Since the provision of equivalent circuits enables autonomous control of the timing of operations such as reading and precharging, reading and precharging can be controlled within a single period of the clock signal from the oscillation device, with no waste, enabling the implementation of a device with a lower power consumption and a higher operating speed.

Embodiment 11

Figures 23, 24:
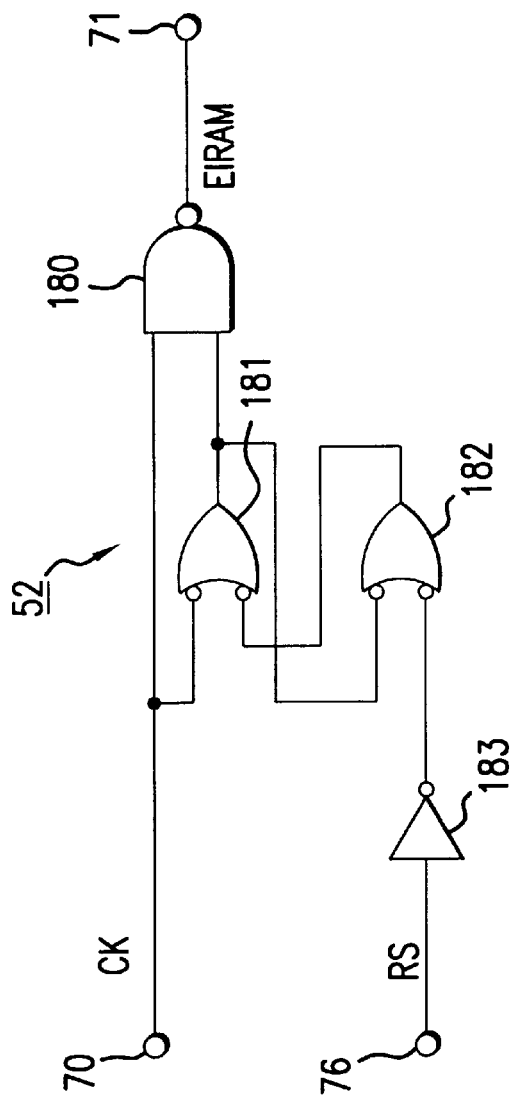
FIG. 23 shows an example of the configuration of the RS latch circuit.
FIGS. 24, 24A, and 24B show the configuration of Embodiment 11 (a specific example of the driver circuit)
Figure 24A:
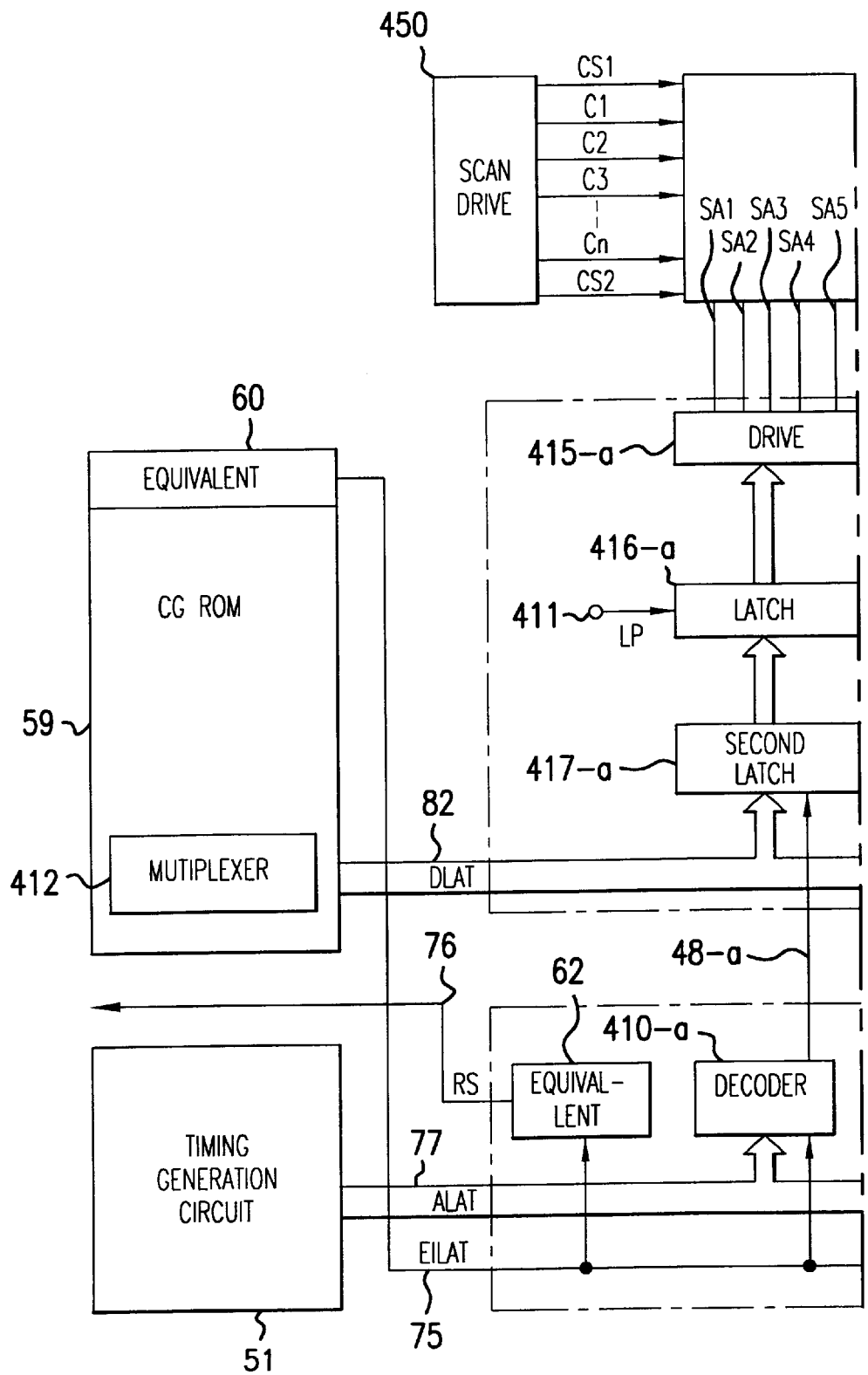
Figure 24B:
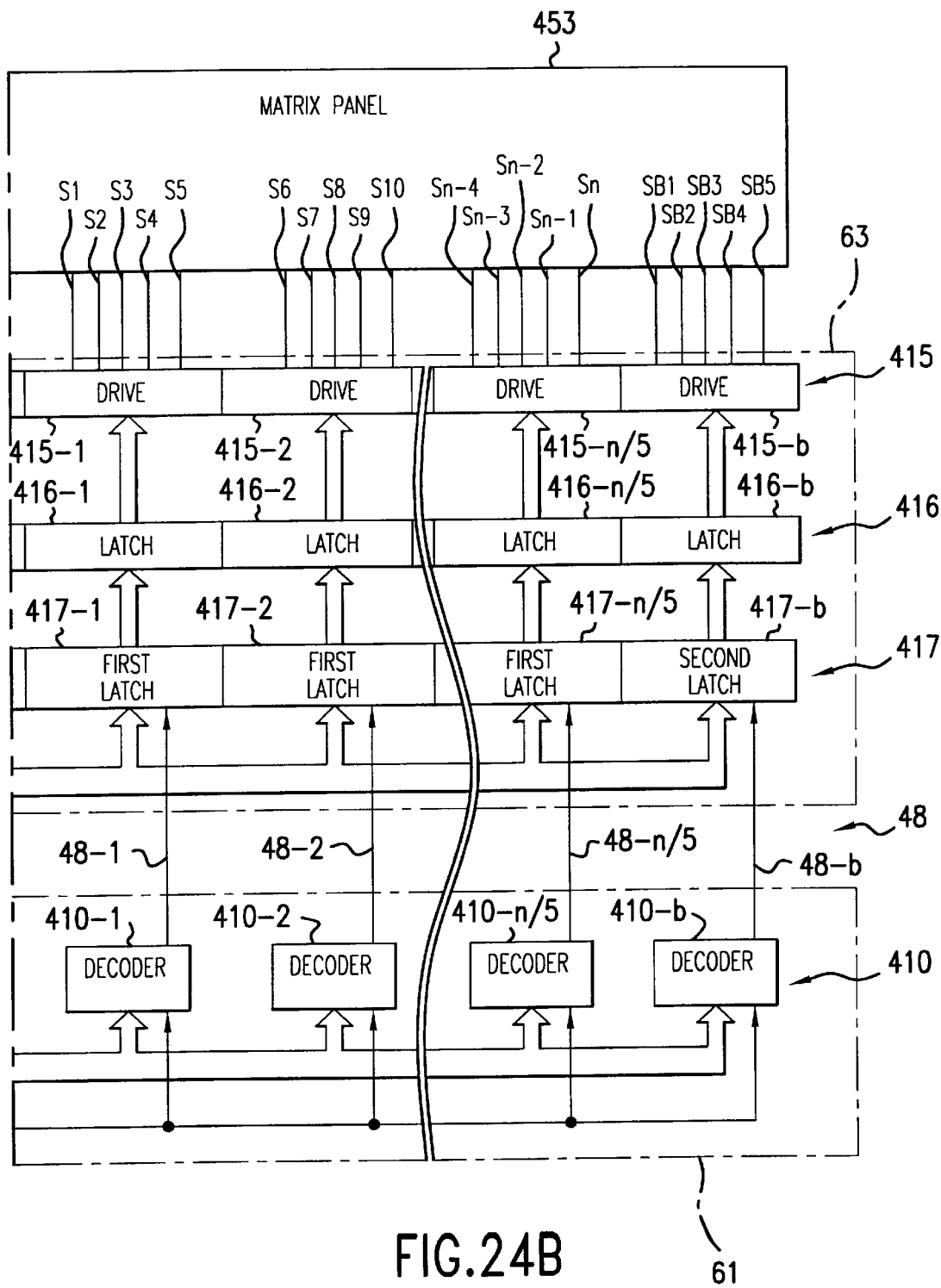

An eleventh embodiment of this invention illustrates a specific configuration of a driver circuit, this configuration being as shown in FIGS. 24, 24A and 24B.

Figure 25:
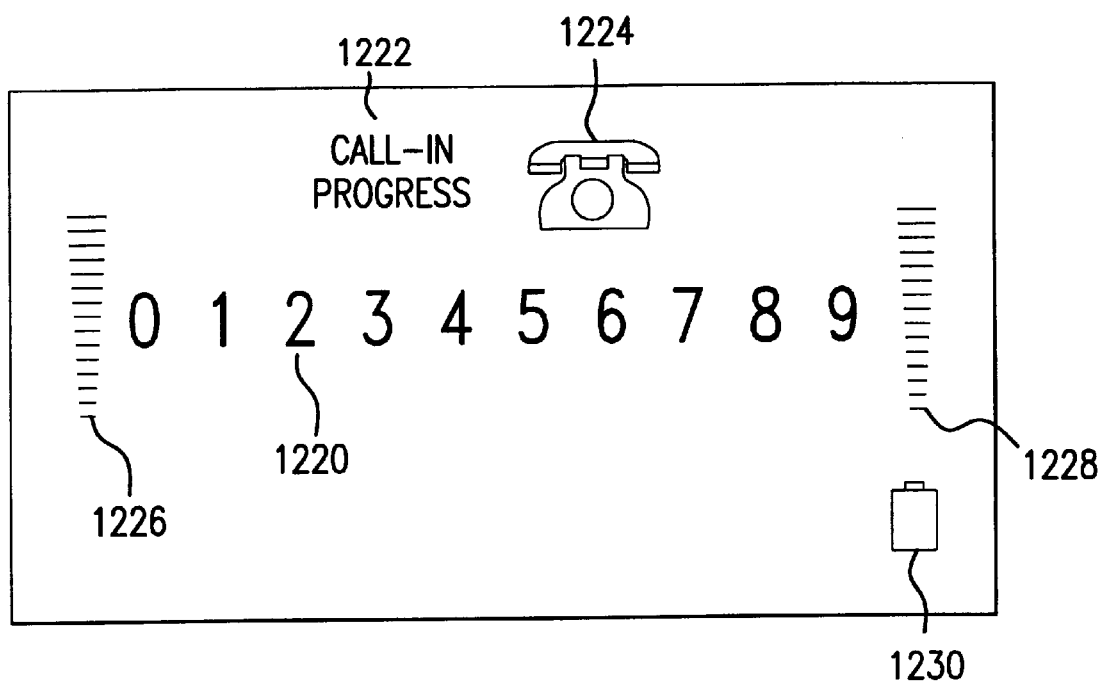
FIG. 25 shows an example of the display on a matrix panel.

As shown in these figures, a driver circuit (hereinafter called "signal drive circuit") 63 comprises a drive section 415 and line memories 416 and 417. The drive section 415 comprises drive circuits 415-a, 415-b, and 415-1 to 415-n/5, a line memory 416 comprises latches 416-a, 416-b, and 416-1 to 416-n/5, and a line memory 417 comprises second latches 417-a and 417-b and first latches 417-1 to 417-n/5. Outputs of the signal drive circuit 63 are output to signal electrodes SA1 to SA5, S1 to Sn, and SB1 to SB5 on a matrix panel 453. Pixels such as liquid crystal elements are arranged in a matrix form on the matrix panel 453, and the plurality of signal electrodes SA1 to SA5, S1 to Sn, and SB1 to SB5 and a plurality of scan electrodes Cs1, C1 to Cm, and Cs2 are arranged in a mutually intersecting manner thereon. In this case, the electrodes S1 to Sn and C1 to Cm are used for character display, whereas the electrodes SA1 to SA5, SB1 to SB5, Cs1, and Cs2 are used for icon display. An example of the screen displayed by the matrix panel 453 in accordance with Embodiment 11 is shown in FIG. 25. Characters 1220 and icons 1222 to 1230 are displayed on this screen. A "call-in-progress" icon 1222 and a telephone icon 1224 are displayed in an icon display region along the upper edge of the screen and battery-power-remaining indicator icons 1226 and 1228 are displayed in icon display regions on the left and right sides thereof. A battery icon 1230 is displayed in an icon display region on the lower edge of the screen. Thus icons can be displayed on the upper and lower edges and left and right sides of the screen in accordance with Embodiment 11.

The drive section 415 is designed to generate signals for driving the signal electrodes SA1 to SA5, S1 to Sn, and SB1 to SB5, and these signals enable the display of the characters and icons shown in FIG. 25. In this case, the drive circuits 415-*a* and 415-*b* are used for icon display and the drive circuits 415-1 to 415-n/5 are used for character display. The line memory 416 latches data from the line memory 417 in accordance with latch pulses LP 411, and the latched data is transferred to the drive section 415 once every horizontal period. In this case, the latches 416-*a* and 416-*b* are used for icon display and the latches 416-1 to 416-n/5 are used for character display. The line memory 417 is designed to store in a time-division manner the DLAT signal 82 that is output from the CGROM 59, on the basis of fetch signals 48 (48-*a*, 48-*b*, and 48-1 to 48-n/5). In this case, the second latches 417-*a* and 417-*b* and the fetch signals 48-*a* are 48-*b* are used for icon display and the first latches 417-1 to 417-n/5 and 48-1 to 48-n/5 are used for character display.

The CGROM 59 generates not only character Pattern data, but also icon pattern data. The generated character pattern data and icon pattern data is multiplexed by a multiplexer 412 included within the CGROM 59 to generate the DLAT signal 82 which is a signal consisting of the character pattern data and icon pattern data arrayed in a time series manner. The character pattern data within the DLAT signal 82 is sequentially stored in the first latches 417-1 to 417-n/5 by the fetch signals 48-1 to 48-n/5. Similarly, the icon pattern data within the DLAT signal 82 is stored in the second latches causes characters to be displayed on the signal electrodes S1 to Sn corresponding to the first latches 417-1 to 417-n/5, as well as icons on the signal electrodes SA1 to SA5 and SB1 to SB5 corresponding to the second latches 417-*a* and 417-*b*.

If, for example, the fetch signals 48-*a* and 48-*b* are generated simultaneously when predetermined icon pattern data is being output as the DLAT signal 82, the same icon can be displayed simultaneously in two different regions as shown in FIG. 25 (as the indicator icons 1226 and 1228). If, for example, the fetch signal 48-2 is generated when icon pattern data is being output as the DLAT signal 82, an icon can be displayed in the character display region. Thus this embodiment enables the display of characters and icons in any region on the matrix panel 453, making it possible to display more complicated, high-quality images on the matrix panel. This embodiment also enables movement of characters and icons. This movement of characters is enabled by controlling the generation timing of the fetch signal 48. Such an ability to move the character display would be useful in an application such as a portable telephone, to enable processing that moves characters indicating previously dialed numbers to the left as each dial button is pressed.

The address decoder 61 that generates the fetch signal 48 comprises decoder circuits 410 (410-*a*, 410-1 to 410-n/5, and 410-*b*) and the equivalent circuit 62, as shown in FIG. 24. The timing of the generation of the fetch signal 48 (48-*a*, 48-1 to 48-n/5, and 48-*b*) can be controlled by means such as programming a ROM for the decoder circuit 410. The decoder circuit 410-*a* is equivalent to series-connected ROM sufficient for one address line and an output cell, and may comprise the MOS transistors 160 to 165, 170, and 171 and the MOS inverter 174 of FIG. 22. The decoder circuits 410-1 to 410-n/5 and 410-*b* are similar. Therefore, the timing of the generation of the fetch signal (translated address signal) 48 (the timing at which it is enabled) can be controlled by ROM programming, that is, by setting which of the MOS transistors is to have its drain and source regions short-circuited. The RAM address signal (ALAT) 77 is sequentially incremented so that it changes (0000), (0001) . . . (1111), for example, and the decoder circuit 410-*a* decodes this ALAT 77. When ALAT 77 has reached a predetermined value, the decoder circuit 410-*a* is selected to generate the fetch signal 48-*a*, and this causes data that is output as the DLAT signal 82 to be stored in the second latch 417-*a*. For example, if the configuration is such that both of the decoder circuits 410-*a* and 410-*b* are selected and both of the fetch signals 48-*a* and 48-*b* are generated when ALAT 77 is at the predetermined value, the same icon (the indicator icons 1226 and 1228) can be displayed at two different locations, as shown in FIG. 25.

The equivalent circuit 62 has, as described with reference to FIG. 22, the same circuit configuration as the decoder circuit, and the precharge signal (RS) 76 is enabled at substantially the same time as the fetch signal 48 is generated (enabled), or later. This makes it possible for the RS signal 76 to be enabled and the display data RAM and CGROM to switch to precharging at the point at which data has been written to at least the line memory 417, or thereafter.

Note that two types of data, character pattern data and icon pattern data, are considered as the data (data comprised within the DLAT signal 82) stored by the line memory 417 in Embodiment 11. However, this invention is not limited thereto; first to Lth (where L is an integer) types of data may also be stored in the line memory 417. In such a case, the line memory 417 would also comprise first to Lth latches. It should be noted, however, that the circuit configurations of the first to Lth latches need not be mutually identical.

Embodiment 12

Figure 26:
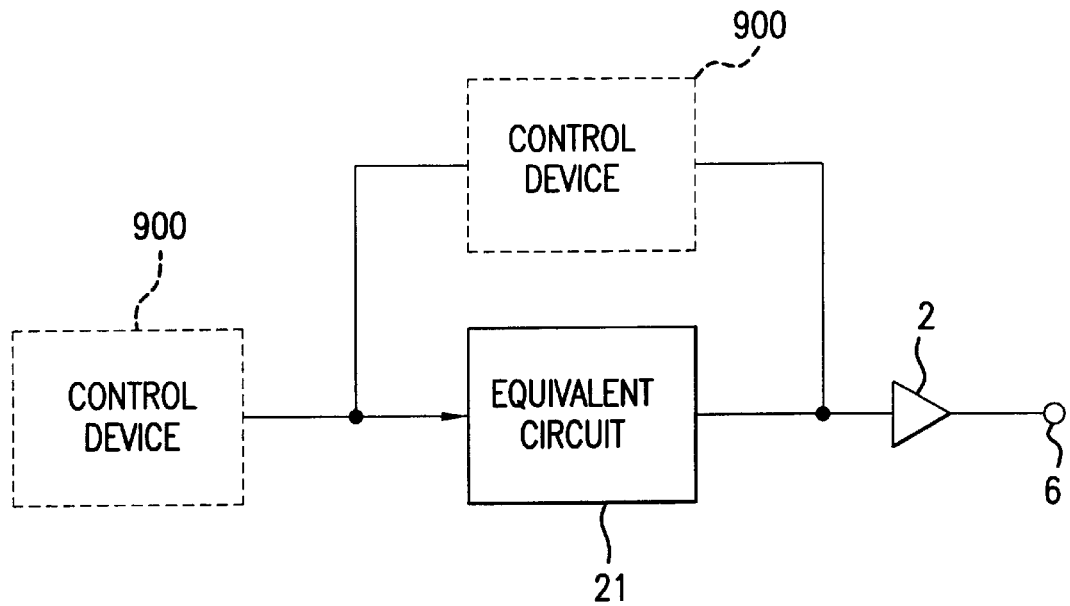
FIG. 26 shows the configuration of Embodiment 11 which generates an oscillation signal by using an equivalent circuit comprised within the display data processing device.

A twelfth embodiment of this invention relates to the generation of the oscillation signal by using an equivalent circuit comprised within a display data processing device, with the configuration thereof being as shown in FIG. 26.

An equivalent circuit 21 corresponds to the equivalent circuits 354 and 356 of Embodiment 7 (see FIG. 9), the equivalent circuits 354, 356 and 358 of Embodiments 8 and 9 (see FIGS. 11 and 13), or equivalent circuits 54, 56, 58, 60, and 62 of Embodiment 10 (see FIG. 15). The output of the equivalent circuit 21, such as the third signal 373 of Embodiment 7 or the fourth signal 376 of Embodiment 8, is fed back as shown in FIG. 26 as a first signal, to form a self-oscillation loop. This enables oscillation that uses a signal delay generated by the equivalent circuit 21.

In this case, it is preferable to provide a control device 900 that enables control over at least one of the oscillation frequency and duty ratio, as shown in FIG. 26. Such a configuration makes it Possible to bring the oscillation frequency closer to the frequency required of the oscillation device, if variations in quality due to the fabrication process have changed the intrinsic delay of the equivalent circuit 21, for example, changing the thus-obtained oscillation frequency. This also controls the duty ratio and makes it possible for the memory and other components within the display data processing device to work correctly.

Figure 27:
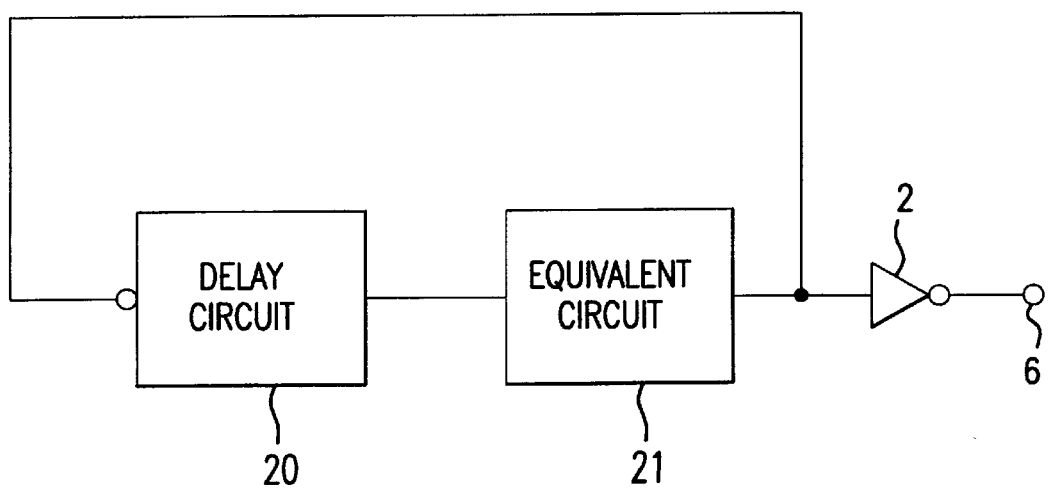
FIG. 27 shows an example of the configuration in which a ring oscillator is formed by Embodiment 11.

An example of the configuration shown in FIG. 27 concerns a ring oscillator in which the output of the equivalent circuit 21 is fed back to the input of the equivalent circuit 21 through a delay circuit 20. In this case, the delay circuit 20 is equivalent to the control device 900 and factors such as oscillation frequency can be controlled by adjusting the signal delay in the delay circuit 20. This delay circuit 20 may be replaced by components such as a waveform-shaping inverter and buffer.

Figure 28:
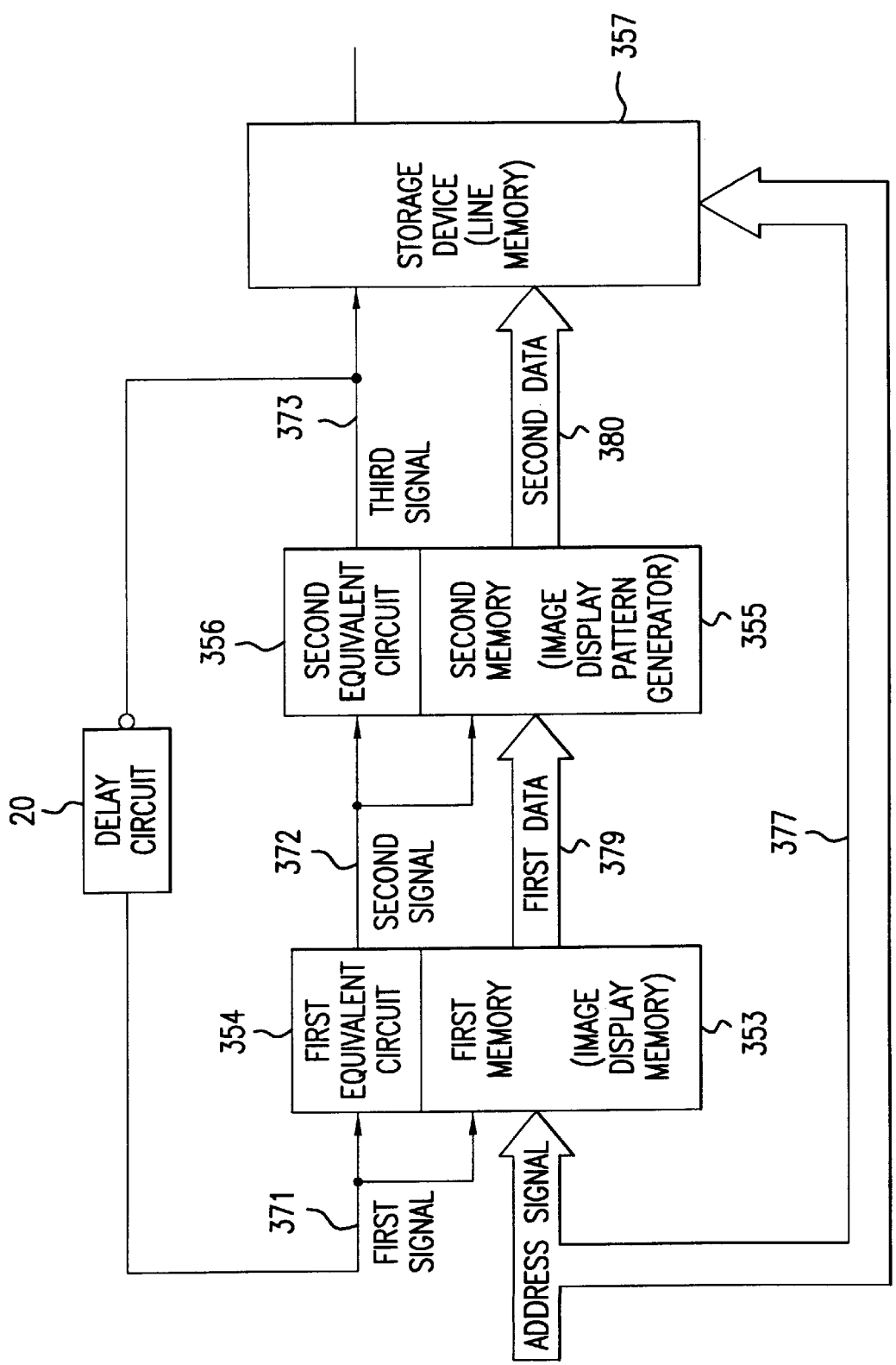
FIG. 28 shows an example of the configuration in which a ring oscillator is formed by a combination with Embodiment 7.

Another example of the configuration of a ring oscillator, shown in FIG. 28, has the circuitry of Embodiment 7 to which is added the delay circuit 20 to form a self-oscillation loop.

If a prior-art ring oscillator is made to oscillate at a comparatively low frequency of about 10 kHz to 500 kHz, the size of the circuitry and also the number of components become extremely large, making them unsuitable for practical use. However, since Embodiment 12 makes use of the intrinsic delay of an equivalent circuit, the circuit size is not so large and oscillation can be obtained at such low frequencies.

Figure 29:
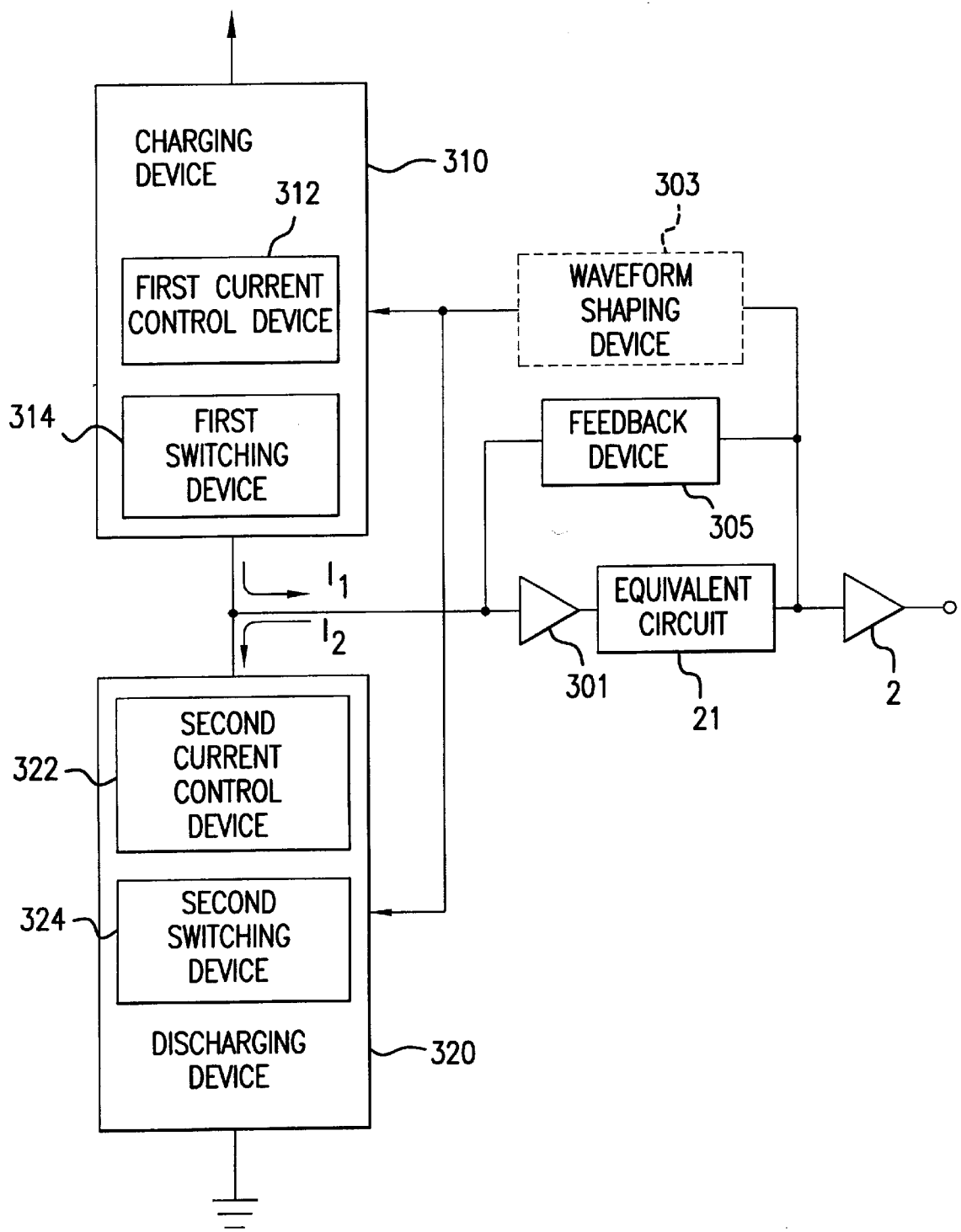
FIG. 29 shows an example of the configuration wherein oscillation frequency and duty ratio are controlled by a combination with Embodiment 1.
Figure 30:
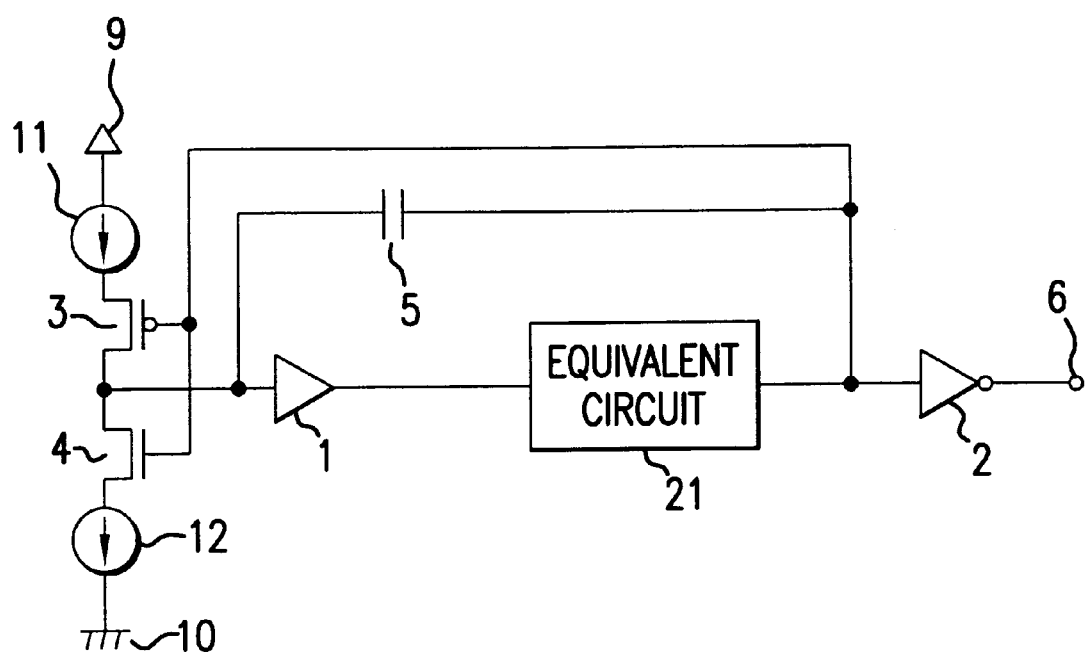
FIG. 30 shows an example of the configuration wherein oscillation frequency and duty ratio are controlled by a combination with Embodiment 3.

An example of the configuration of a combination of this embodiment and the oscillation device of Embodiment 1, when used to control both the oscillation frequency and the duty ratio, is shown in FIG. 29. As should be understood from a comparison of FIGS. 1 and 29, this configuration is the same as that of Embodiment 1, except that the equivalent circuit 21 is added to the output of the MOS buffer 301. In this case, a buffer device is configured of the MOS buffer 301 and the equivalent circuit 21. It should be noted, however, that it is not absolutely necessary to provide the MOS buffer 301, An example of the configuration of a combination of this embodiment and the oscillation device of Embodiment 3, when used to control both the oscillation frequency and the duty ratio, is shown in FIG. 30. In this case, assume that the intrinsic delay of the equivalent circuit 21 is t(21) and the currents of the current sources 11 and 12 are In and Ip. The oscillation frequency fOSC12 of this circuit is given by:

fOSC12=1/(Tn+Tp+t(21)},

It should be noted, however, that Tn=C×V/In and Tp=C× V/Ip, with the intrinsic delay of the MOS buffer 1 being omitted. Thus oscillation frequency fOSC12 can be freely adjusted and set by adjusting the currents In and Ip of the current sources 11 and 12.

Use of the above described Embodiment 12 makes it possible to obtain the advantages of both the oscillation devices of Embodiments 1 to 6 and the display data processing devices of Embodiments 7 to 11. The operating time can be distributed between the circuits (such as memories) within the display data processing device with no waste, and also the oscillation frequency of the oscillation device can be determined by using the intrinsic delays of these circuits. This ensures that changes in the fabrication process are less likely to have any effect and enables the provision of a display data processing device that is capable of operating faster with a lower power consumption.

Note that this invention is not limited to the above described Embodiments 1 to 12; it can be embodied in various different forms within the scope of the invention as laid out in the accompanying claims.

For example, the configuration of the charging and discharging devices of Embodiment 1 are not limited to the configurations that were described as Embodiments 2 to 6. Similarly, although a bias circuit and bias adjustment circuit are provided in FIG. 4, they need not be provided, and the configuration of the bias circuit and bias adjustment circuit is not limited to the examples described as Embodiments 4 to 6.

The memory included within the display data processing device is not limited to display data RAM and CGROM; any other type of memory may be used instead. The insertion of other circuits between components such as memory sections is also within the range of this invention. Various different devices, such as latches or memory modules, may be used as the storage device, provided that at least data can be stored therein. The address decoder is similarly not limited to the configurations described with reference to Embodiment 10 onward.

Figure 31:
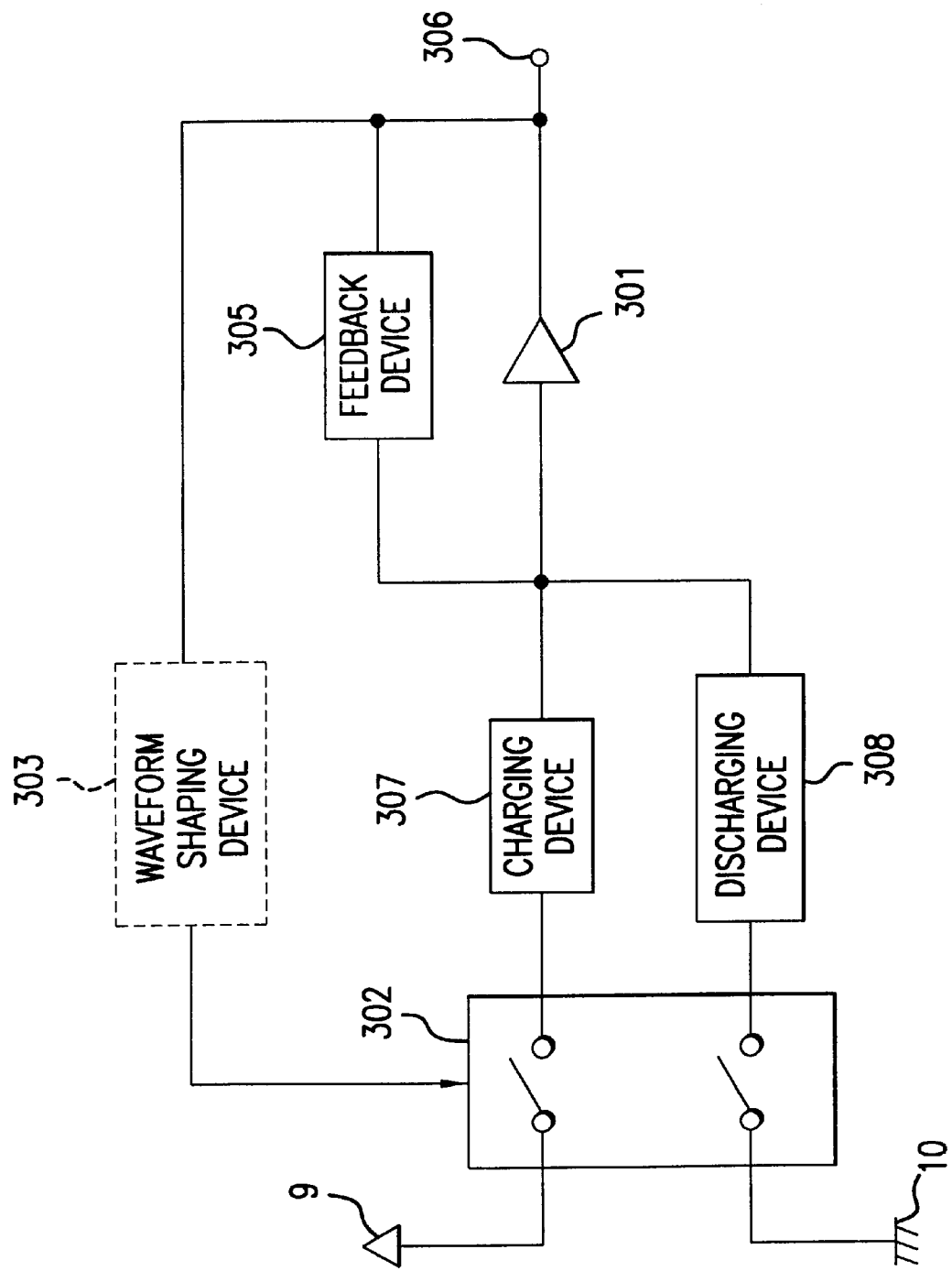
FIG. 31 shows an example of the configuration of an oscillation device capable of adjusting the oscillation frequency and duty ratio.
Figure 32A:
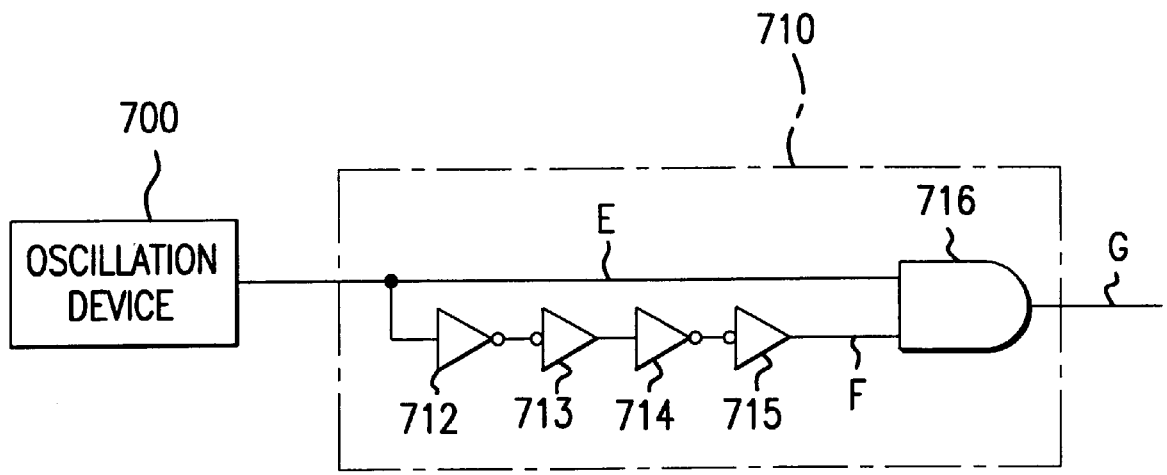
FIG. 32A shows an example of the configuration of an oscillation device that uses a waveform shaping circuit and FIG. 32B is a timing chart thereof.
Figure 32B:
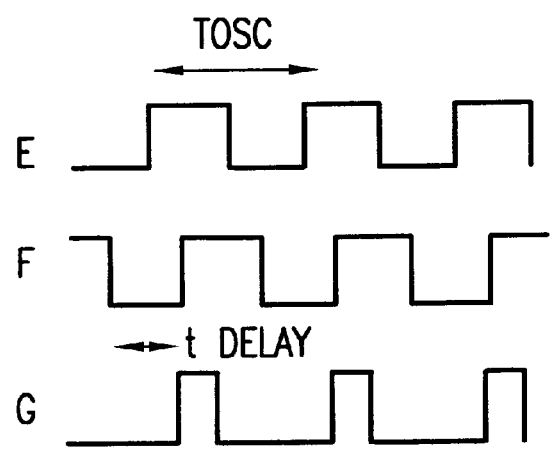

Any combination of the oscillation devices of Embodiments 1 to 6 with the display data processing devices of Embodiments 7 to 12 would be particularly effective in lowering the power consumption and reducing the size of the circuitry, but the oscillation device to be combined with the display data processing devices of Embodiments 7 to 12 is not limited to the ones Illustrated by Embodiments 1 to 6. In other words, any oscillation device capable of controlling the duty ratio or oscillation frequency of the oscillation signal can lower power consumption, when combined with the display data processing devices of Embodiments 7 to 12. For example, an oscillation device of the configuration shown in FIG. 31 uses a selection circuit 302 to select either a charging device 307 or discharging device 308 on the basis of the output from the MOS buffer 301, to perform either charging or discharging at the input of the MOS buffer 301. Thus the oscillation frequency and duty ratio of the oscillation signal can be freely adjusted.

Similarly, the duty ratio may be adjusted by combining an oscillation device 700 (which outputs a high-frequency oscillation signal) with a waveform shaping circuit 710 or 720, as shown in FIGS. 32A and 32B or FIGS. 33A and 33B. The waveform shaping circuit 710 of FIG. 32A comprises inverters 712 to 715 and an AND circuit 716. A signal G can be obtained by inputting an oscillation signal E (oscillation period: TOSC) from the oscillation device 700 and a signal F (delayed by a time Tdelay after the oscillation signal E) to an AND circuit 716, as shown in FIG. 325. In this case, the duty ratio D is given by:

D=(TOSC−Tdelay)/TOSC

Therefore the duty ratio can be adjusted by controlling Tdelay.

Figure 33A:
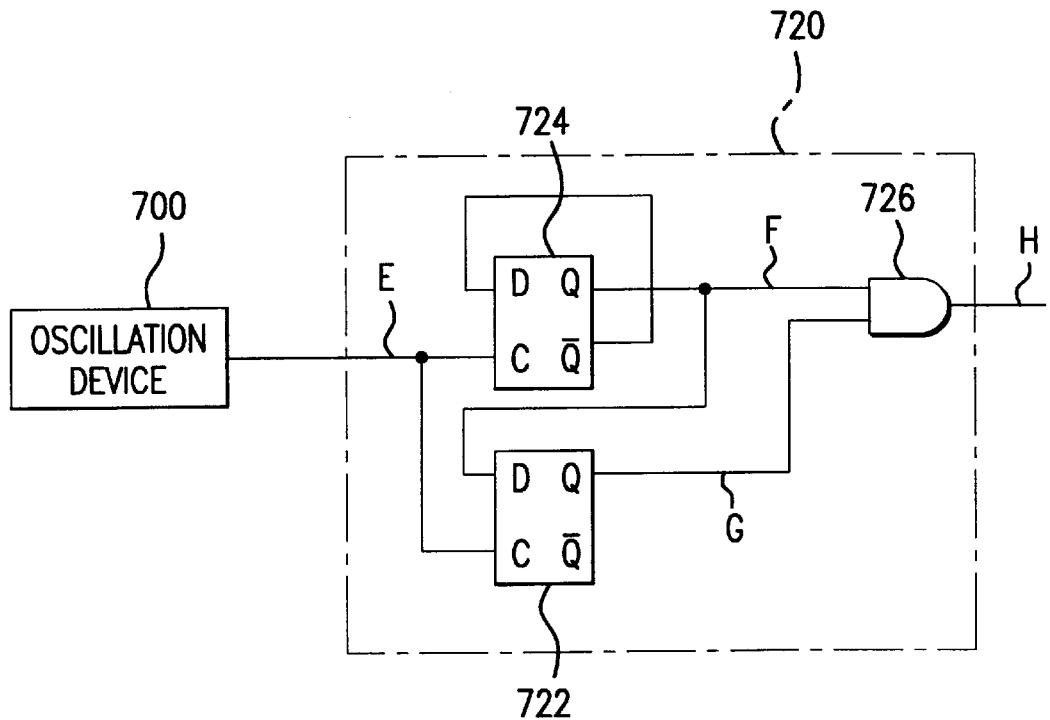
FIG. 33A shows an example of the configuration of an oscillation device that uses a waveform shaping circuit and FIG. 33B is a timing chart thereof.
Figure 33B:
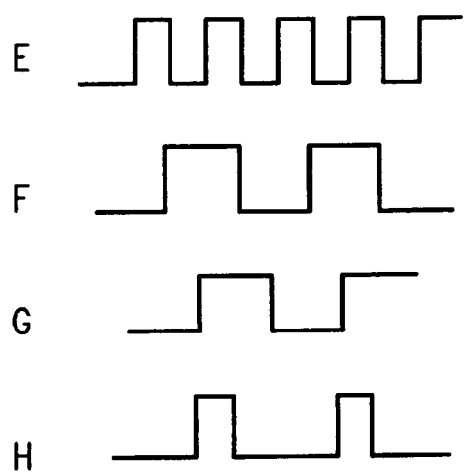
Figure 34:
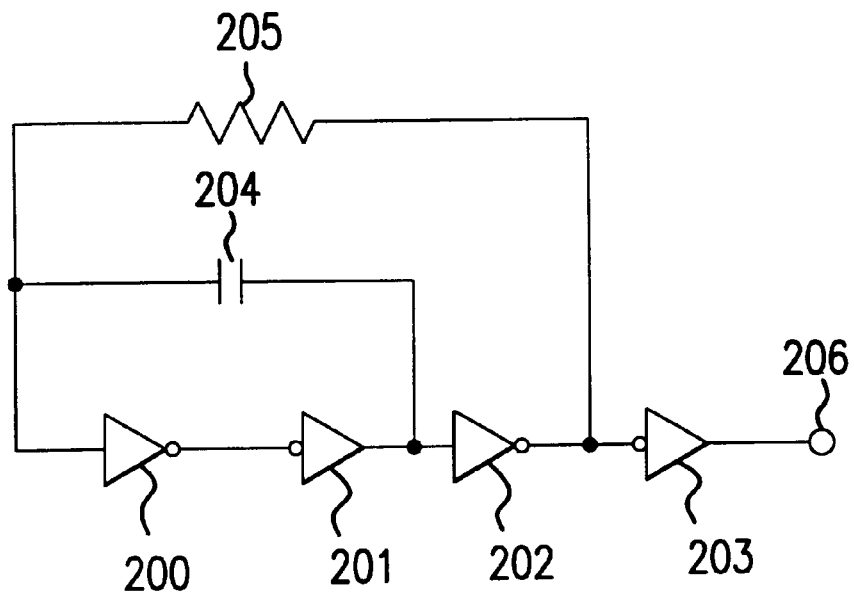
FIG. 34 shows the configuration of a prior-art CR oscillation circuit.
Figure 35:
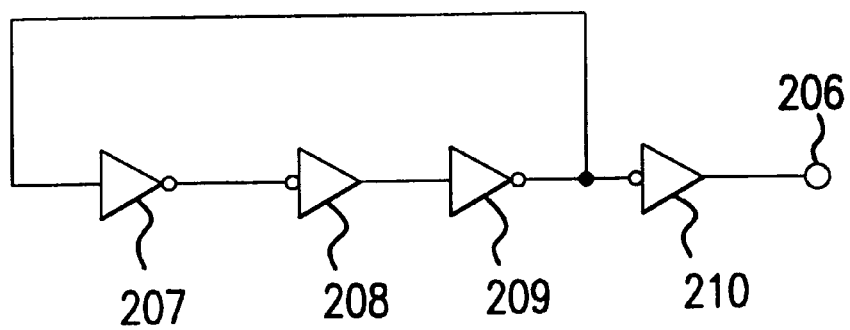
FIG. 35 shows the configuration of a prior-art ring oscillator.

The waveform shaping circuit 720 of FIG. 33A comprises D flip-flops 722 and 724 and an AND circuit 726. A signal H can be obtained by inputting an oscillation signal E from the oscillation device 700 to clock terminals of the D flip-flops 722 and 724, then inputting outputs of these D flip-flops 722 and 724 to the AND circuit 726. As is clear from FIG. 33B, in order to set a duty ratio of 25%, an oscillation signal E having a frequency that is twice that of the signal H is necessary, and in order to set a duty ratio of 12.5%, an oscillation signal E having a frequency that is four times that of the signal H is necessary. From a power consumption viewpoint, using the above configuration provided with a waveform shaping circuit is less advantageous than using the oscillation devices of Embodiments 1 to 6, but this configuration used in combination with any of the display data processing devices of Embodiments 7 to 12 enables a reduction in the power consumed by other components such as the memory and timing generation circuit. This makes it possible to design for an overall reduction in power consumption.

Since the devices in accordance with this invention each have a plurality of memories for the processing of display data, they can be applied not only to a simple matrix type of liquid crystal display device but also to an active matrix type of liquid crystal display device, and also to display devices that use display elements other than liquid crystal elements.

What is claimed is:

1. An oscillation device including a buffer device, feedback means for feeding back an output of said buffer device to an input thereof, and a charging device and a discharging device connected to said input of said buffer device, wherein:

said charging device comprises a first switching device that is turned on or off based on said output of said buffer device and a first current control device that controls a current flowing into said input of said buffer device through said first switching device, and said discharging device comprises a second switching device that is turned on or off based on said output of said buffer device and a second current control device that controls a current flowing out of said input of said buffer device through said second switching device, wherein:

said first and second switching, devices comprise a first transistor of a first conductive type and a second transistor of a second conductive type, respectively, wherein said output of said buffer device is connected to gate electrodes of said first and second transistors, and said first and second current control devices are first and second current sources, respectively, said first and second current sources comprise a third transistor of the first conductive type and a fourth transistor of the second conductive type, respectively, and said oscillation device comprises a bias circuit having a first bias terminal, and a second bias terminal, a gate electrode of said third transistor being connected to said first bias terminal, a gate electrode of said fourth transistor being connected to said second bias terminal, wherein said bias circuit controls at least a current ratio of first and second currents of said first and second current sources, by controlling bias voltages applied to said first and second bias terminals, wherein said bias circuit comprises:

a fifth transistor of the first conductive type, wherein a gate electrode and a drain region of the fifth transistor are connected to said first and second bias terminals, respectively;

a sixth transistor of the first conductive type, wherein a gate electrode and a drain region of the sixth transistor are connected to said first bias terminal;

a seventh transistor of the second conductive type, wherein a gate electrode and a drain region of the seventh transistor are connected to said second bias terminal; and an eighth transistor of the second conductive type, wherein a gate electrode of the eighth transistor is connected to said second bias terminal and the drain region of the eighth transistor is connected to said first bias terminal.

2. An oscillation device including a buffer device, feedback means for feeding back an output of said buffer device to an input thereof, and a charging device and a discharging device connected to said input of said buffer device, wherein:

said charging device comprises a first switching device that is turned on or off based on said output of said buffer device and a first current control device that controls a current flowing into said input of said buffer device through said first switching device, and said discharging device comprises a second switching device that is turned on or off based on said output of said buffer device and a second current control device that controls a current flowing out of said input of said buffer device through said second switching device, wherein:

said first and second switching devices comprise a first transistor of a first conductive type and a second transistor of a second conductive type, respectively, wherein said output of said buffer device is connected to gate electrodes of said first and second transistors, and said first and second current control devices are first and second current sources, respectively, said first and second current sources comprise a third transistor of the first conductive type and a fourth transistor of the second conductive type, respectively, and said oscillation device comprises a bias circuit having a first bias terminal, a second bias terminal, and a third bias terminal, a gate electrode of said third transistor being connected to said third bias terminal, a gate electrode of said fourth transistor being connected to said second bias terminal, wherein said bias circuit controls at least a current ratio of first and second currents of said first and second current sources, by controlling bias voltages applied to said second and third bias terminals, wherein said bias circuit comprises:

a fifth transistor of the first conductive type, wherein a gate electrode and a drain region of the fifth transistor are connected to said first and second bias terminals, respectively;

a sixth transistor of the first conductive type, wherein a gate electrode and a drain region of the sixth transistor are connected to said first bias terminal;

a seventh transistor of the second conductive type, wherein a gate electrode and a drain region of the seventh transistor are connected to said second bias terminal; and an eighth transistor of the second conductive type, wherein a gate electrode of the eighth transistor is connected to said second bias terminal and the drain region of the eighth transistor is connected to said first bias terminal, and said oscillation device comprises a ninth transistor of the first conductive type, wherein a gate electrode and a drain region of the ninth transistor are connected to said third bias terminal; and a tenth transistor of the second conductive type, wherein a gate electrode and a drain region of the tenth transistor are connected to said second and third bias terminals, respectively.

* * * * *